United States Patent
Lu et al.

(10) Patent No.: US 10,193,090 B2
(45) Date of Patent: Jan. 29, 2019

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Chun-Chieh Lu, Taipei (TW); Jean-Pierre Colinge, Hsinchu (TW); Ken-Ichi Goto, Hsin-Chu (TW); Zhiqiang Wu, Hsinchu (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/627,722

(22) Filed: Jun. 20, 2017

(65) Prior Publication Data
US 2018/0366666 A1    Dec. 20, 2018

(51) Int. Cl.
*H01L 51/05* (2006.01)
*H01L 51/00* (2006.01)
*H01L 51/10* (2006.01)

(52) U.S. Cl.
CPC ........ *H01L 51/057* (2013.01); *H01L 51/0048* (2013.01); *H01L 51/055* (2013.01);
(Continued)

(58) Field of Classification Search
CPC . H01L 51/057; H01L 51/105; H01L 51/0558; H01L 51/0525; H01L 51/0048; H01L 51/055; H01L 51/0003
See application file for complete search history.

(56) References Cited

U.S. PATENT DOCUMENTS 8,173,993 B2 * 5/2012 Bangsaruntip ......... B82Y 10/00
257/38
2006/0234519 A1    10/2006 Pan et al.
(Continued)

FOREIGN PATENT DOCUMENTS

CN    101873992 A    10/2010
CN    104969335 A    10/2015
(Continued)

OTHER PUBLICATIONS

Office Action dated Jun. 21, 2018 from Korean Patent Application No. 10-2017-014148 (5 pages).
Office Action dated Jun. 15, 2018 from Taiwanese Application No. 10720538840 (4 pages).
(Continued)

*Primary Examiner* — David Vu
(74) *Attorney, Agent, or Firm* — McDermott Will & Emery LLP

(57) ABSTRACT

In a method of manufacturing a gate-all-around field effect transistor, a trench is formed over a substrate. Nano-tube structures are arranged into the trench, each of which includes a carbon nanotube (CNT) having a gate dielectric layer wrapping around the CNT and a gate electrode layer over the gate dielectric layer. An anchor layer is formed in the trench. A part of the anchor layer is removed at a source/drain (S/D) region. The gate electrode layer and the gate dielectric layer are removed at the S/D region, thereby exposing a part of the CNT at the S/D region. An S/D electrode layer is formed on the exposed part of the CNT. A part of the anchor layer is removed at a gate region, thereby exposing a part of the gate electrode layer of the gate structure. A gate contact layer is formed on the exposed part of the gate electrode layer.

20 Claims, 25 Drawing Sheets

(52) U.S. Cl.
CPC ...... *H01L 51/0525* (2013.01); *H01L 51/0558* (2013.01); *H01L 51/105* (2013.01); *H01L 51/0003* (2013.01)

(56) References Cited

U.S. PATENT DOCUMENTS

| 2010/0097058 A1 | 4/2010 | Getty |
| 2014/0151765 A1 | 6/2014 | Franklin et al. |
| 2016/0211259 A1 | 7/2016 | Guo et al. |

FOREIGN PATENT DOCUMENTS

| CN | 103107199 B | 1/2016 |
| DE | 102014110425 A1 | 2/2015 |
| KR | 10-2007-0093070 | 9/2007 |

OTHER PUBLICATIONS

Yongho Joo et al., "Dose-Controlled, Floating Evaporative Self-assembly and Alignment of Semiconducting Carbon Nanotubes from Organic Solvents", Sci. Adv. 2 e1601240, 2016, 7 pgs.

Hongsik Park et al., "High-density integration of carbon nanotubes via chemical self-assembly", Nature Nanotechnology, vol. 7, Dec. 2012, pp. 787-791.

Max M. Shulaker et al., "High-Performance Carbon Nanotube Field-Effect Transistors", IEEE 2014, IEDM14-812-IEDM14-815.

Gerald J. Brady et al., "Quasi-ballistic carbon nanotube array transistors with current density exceeding Si and GaAs", Sci. Adv. 2016, Sep. 2, 2016, pp. 1-9.

Qing Cao et al., "Arrays of single-walled carbon nanotubes with full surface coverage for high-performance electronics", Nature Nanotechnology, vol. 8, Mar. 2013, pp. 180-186.

\* cited by examiner

METHOD OF MANUFACTURING A SEMICONDUCTOR DEVICE AND A SEMICONDUCTOR DEVICE

TECHNICAL FIELD

The disclosure relates to method of manufacturing semiconductor integrated circuits, and more particularly to a semiconductor device including a gate-all-around (GAA) field effect transistor (FET) using a carbon nanotube (CNT) and a method of manufacturing the same.

BACKGROUND

As the semiconductor industry has progressed into nanometer technology process nodes in pursuit of higher device density, higher performance, and lower costs, challenges from both fabrication and design issues have resulted in the development of three-dimensional designs, such as GAA structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

In some embodiments, semiconductor devices include a novel structure of field-effect transistors including stacked, gate-all-around (GAA) carbon nanotubes (CNTs). The semiconductor devices include an array of aligned CNTs with a gate dielectric layer wrapping therearound and a gate electrode layer. The GAA FETs with CNTs can be applied to logic circuits in advanced technology node. However, fabricating CNT-based devices has led to problems, such as difficulty in increasing CNT density to obtain higher current, preventing inter-tube interactions that degrade CNT performance in a CNT bundle structure, and/or lack of a feasible fabrication process to integrate high-density GAA CNTs into a circuit. The following embodiments provide a GAA FET using CNTs and its manufacturing process that can resolve these problems.

Figure 1A:
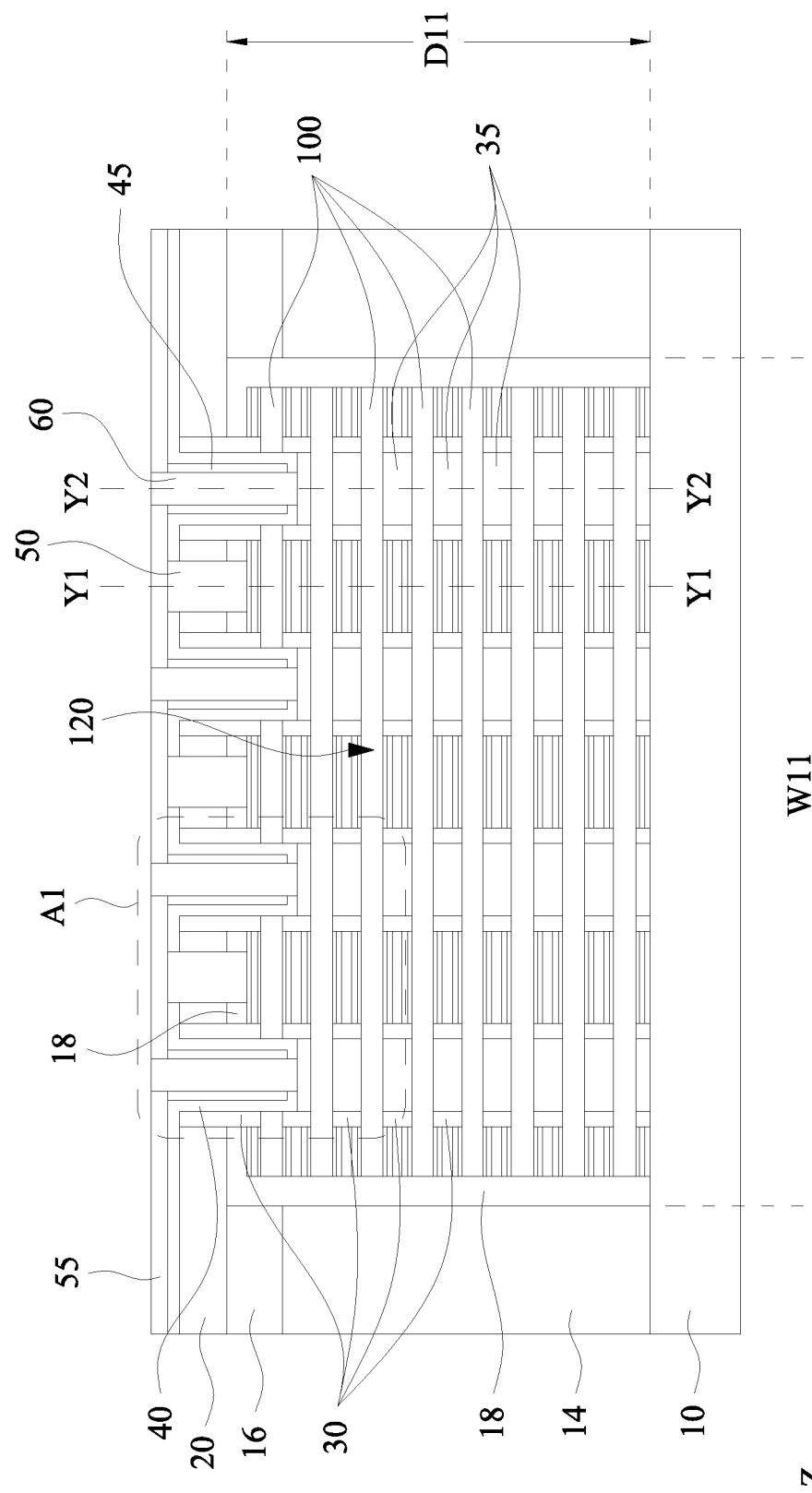
FIG. 1A is a cross sectional view of a GAA FET in accordance with embodiments of the present disclosure.
Figure 1B:
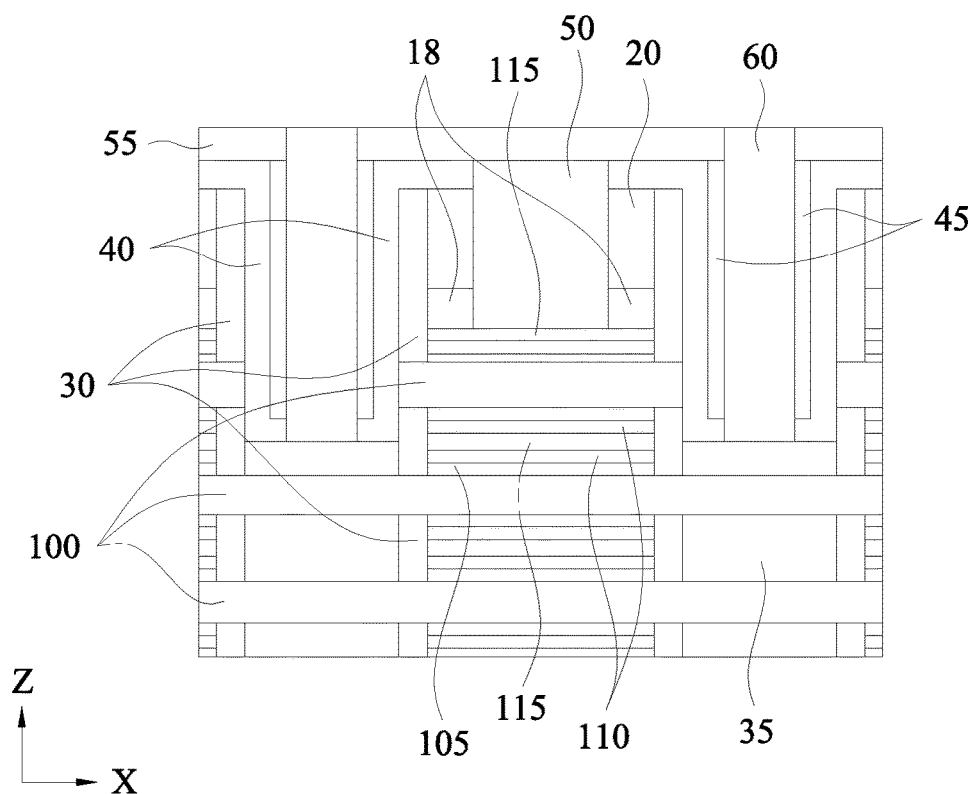
FIG. 1B is an enlarged cross sectional view corresponding to area A1 of FIG. 1A.
Figure 1C:
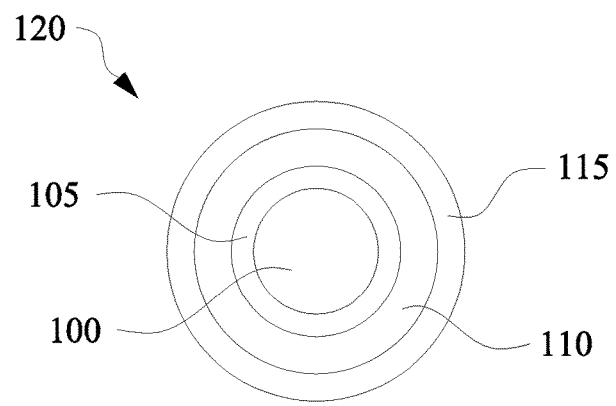
FIG. 1C is a cross sectional view of the CNT portion in accordance with embodiments of the present disclosure.
Figure 1D:
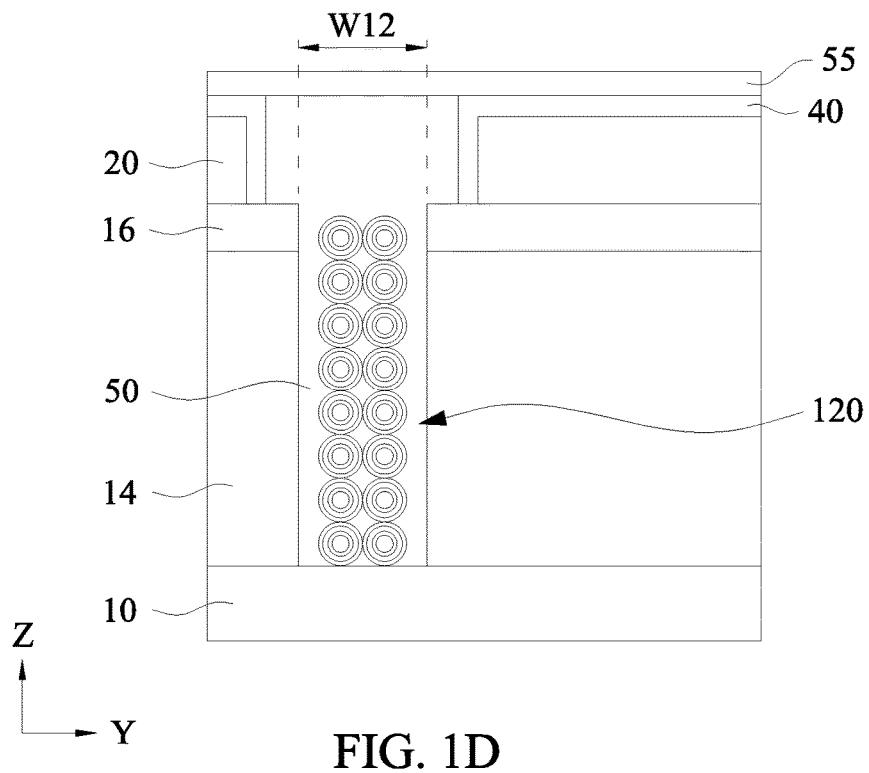
FIG. 1D is a cross sectional view corresponding to line Y1-Y1 of FIG. 1A
Figure 1E:
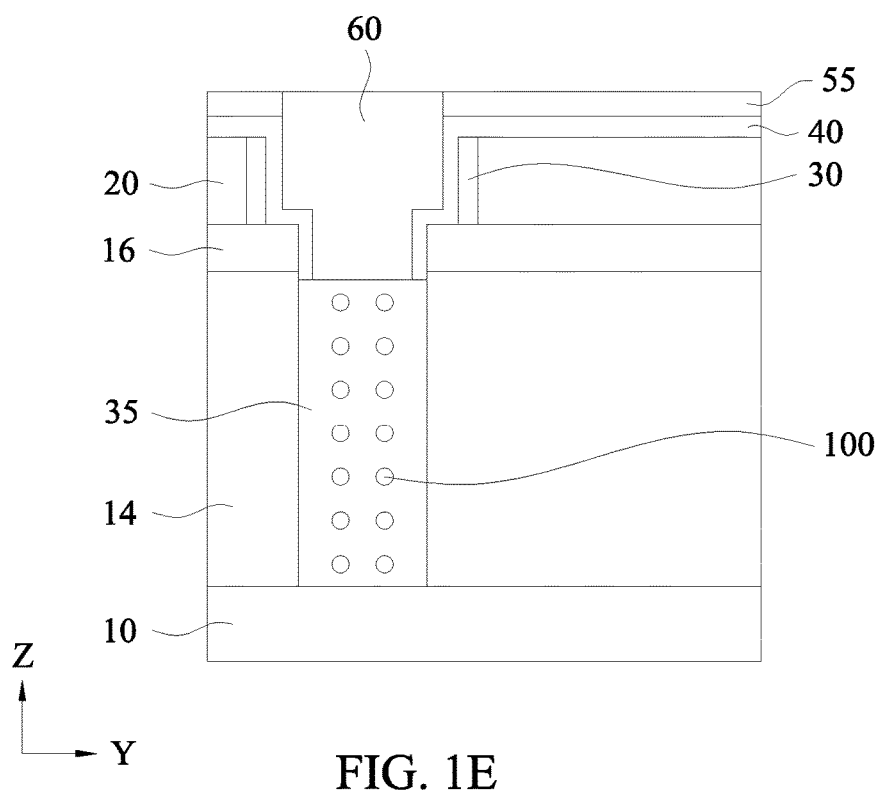
FIG. 1E is a cross sectional view corresponding to line Y2-Y2 of FIG. 1A.

FIG. 1A is a cross sectional view of GAA FETs in accordance with embodiments of the present disclosure. FIG. 1B is an enlarged cross sectional view corresponding to area A1 of FIG. 1A. FIG. 1C is a cross sectional view of the CNT portion in accordance with embodiments of the present disclosure. FIG. 1D is a cross sectional view corresponding to line Y1-Y1 of FIG. 1A and FIG. 1E is a cross sectional view corresponding to line Y2-Y2 of FIG. 1A.

The GAA FETs are disposed over a substrate 10. One or more trenches (see, 305 shown in FIG. 3C) is provided over the substrate 10, in which CNT structures 120 are disposed. The trench has walls made of a first insulating layer 14 and a second insulating layer 16. The trench has a width W11 in the X direction, a width W12 in the Y direction and a depth D11 in the Z direction. The width W11 is in a range of about 50 nm to about 2000 nm in some embodiments, and is in a range from about 100 nm to about 1000 nm in other embodiments. The width W12 is in a range from about 10 nm to about 100 nm in some embodiments, and is in a range from about 20 nm to about 50 nm in other embodiments. The depth D11 is in a range from about 20 nm to about 200 nm in some embodiments, and is in a range from about 40 nm to about 100 nm in other embodiments. The second insulating layer 16 is optional and is not used in certain embodiments.

In some embodiments, the substrate 10 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. An insulating material, such as a glass, may be used as the substrate. The first insulating layer 14 includes a silicon oxide based material, such as $SiO_2$ or other suitable insulating material, and the second insulating layer 16 is made of a different material than the first insulating layer 14 and includes a silicon nitride based material, such as SiN or other suitable insulating material, in some embodiments.

The CNT structures 120 are stacked in the trench and fixed by anchor layers 18 at both ends of the CNT structures 120. The anchor layer 18 includes one or more selected from the group consisting of polysilicon, amorphous silicon, silicon oxide ($SiO_2$), silicon nitride (SiN) and silicon oxynitride (SiON), or any other suitable material. The anchor layer 18 is conductive in some embodiments, and is insulative in other embodiments. In one embodiment, undoped polysilicon is used as the anchor layer. The total number of the CNT structures 120 per trench is in a range from about 20 to about 200 in some embodiments.

Each of the CNT structures 120 includes a carbon nanotube (CNT) 100 as a core structure, and has one or more gate portions, one or more source/drain (S/D) portions, and anchor portions. At the gate portions and the anchor portions, the CNT 100 is wrapped around by an interfacial layer 105 and a gate dielectric layer 110. Further, a gate electrode layer 115 is formed on the gate dielectric layer 110.

The diameter of the CNT 100 is in a range from about 1.0 nm to about 2.0 nm in some embodiments. The interfacial layer 105 is made of, for example, $SiO_2$ and has a thickness in a range from about 0.5 nm to about 1.5 nm in some embodiments. In other embodiments, the thickness of the interfacial layer 105 is in a range from about 0.6 nm to about 1.0 nm.

The gate dielectric layer 110 is made of $SiO_2$ in some embodiments. In other embodiments, the gate dielectric layer 110 includes one or more high-k dielectric layers having a dielectric constant greater than that of $SiO_2$. For example, the gate dielectric layer 110 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The gate dielectric layer may be made of different materials for a p-channel FET and an n-channel FET. In some embodiments, the gate dielectric layer 110 is made of $HfO_2$ for an n-channel FET, and is made of $Al_2O_3$ for a p-channel FET. The gate dielectric layer 110 has a thickness in a range from about 0.5 nm to about 2.5 nm in some embodiments, and has a thickness in a range from about 1.0 nm to about 2.0 nm in other embodiments.

The gate electrode layer 115 includes one or more conductive materials selected from a group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the gate electrode layer 115 includes a conductive material selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $TaN_x$, and $TaSi_xN_y$ may be used. In certain embodiments, TiN is used as the gate electrode layer 115. The gate electrode layer 115 has a thickness in a range from about 0.5 nm to about 5.0 nm in some embodiments, and has a thickness in a range from about 0.8 nm to about 1.5 nm in other embodiments.

The diameter of the entire CNT structure 120 of the gate portion with the CNT 100, the interfacial layer 105, the gate dielectric layer 110 and the gate electrode layer 115 is in a range from about 5.0 nm to about 15 nm in some embodiments.

In the trench, adjacent CNT structures 120 are in contact with each other at the gate electrode layers. Further, a gate contact layer 50 is formed in and above the trench and in contact with the gate electrode layer 115. The gate contact layer 50 includes one or more conductive materials, such as W, Cu, Ti, Ag, Al, TiAl, TiAlN, TaC, TaCN, TaSiN, Mn, Co, Pd, Ni, Re, Ir, Ru, Pt, and Zr. In certain embodiments, W is used as the gate contact layer 50.

In the S/D portions of the CNT structure 120, the CNT 100 is not covered by the interfacial layer 105, the gate dielectric layer 110 and the gate electrode layer 115. The CNT 100 at the S/D portion is in contact with and wrapped around by an S/D electrode layer 35 formed in the trench. The S/D electrode layer 35 includes one or more conductive materials, such as W, Cu, Ti, Ag, Al, TiAl, TiAlN, TaC, TaCN, TaSiN, Mn, Co, Pd, Ni, Re, Ir, Ru, Pt, and Zr. In certain embodiments, W is used as the S/D electrode layer 35.

In some embodiments, a first spacer layer 30 is formed between the S/D electrode layer 35 and the gate stack (the interfacial layer 105, the gate dielectric layer 110 and the gate electrode layer 115) and the gate contact layer 50, to electrically isolate the S/D electrode layer 35 from the gate electrode layer 115 and the gate contact layer 50. The first spacer layer 30 includes one or more of silicon oxide ($SiO_2$), silicon nitride (SiN) and silicon oxynitride (SiON), or any other suitable material, and has a thickness in a range from about 1 nm to about 10 nm in some embodiments, and has a thickness in a range from about 2 nm to about 5 nm in other embodiments.

Further, in some embodiments, a third insulating layer 20 is formed on the second insulating layer 16 and over part of the trench. The third insulating layer 20 is made of a silicon oxide based material, such as $SiO_2$. In addition, a first etch stop layer (ESL) 40 and a second ESL 55 are disposed over the third insulating layer in some embodiments. The first and second ESLs are made of silicon nitride based material, such as SiN.

In addition, an S/D contact layer 60 is formed passing through a fourth insulating layer 45 formed in the trench and the first and second ESLs 40, 55. The S/D contact layer is in contact with the S/D electrode layer 35. The upper portion of the gate contact layer 50 passes through the anchor layer 18, the third insulating layer 20 and the first and second ESLs 40, 55. The fourth insulating layer 45 is made of a silicon oxide based material, such as $SiO_2$.

FIGS. 2A-2M illustrate various stages of a sequential fabrication process of CNT structures in accordance with embodiments of the present disclosure. It is understood that additional operations can be provided before, during, and after processes shown by FIGS. 2A-2M, and some of the operations described below can be replaced or eliminated, for additional embodiments of the method. The order of the operations/processes may be interchangeable. Materials, configurations, dimensions, processes and/or operations same as or similar to those described with respect to FIGS. 1A-1E may be employed in the following embodiments and the detailed explanation may be omitted.

Figure 2A:
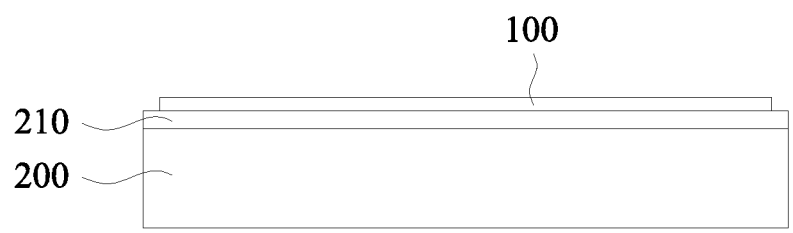
FIG. 2A illustrates one of the various stages of a sequential fabrication process of CNT gate structures in accordance with embodiments of the present disclosure.
Figure 2B:
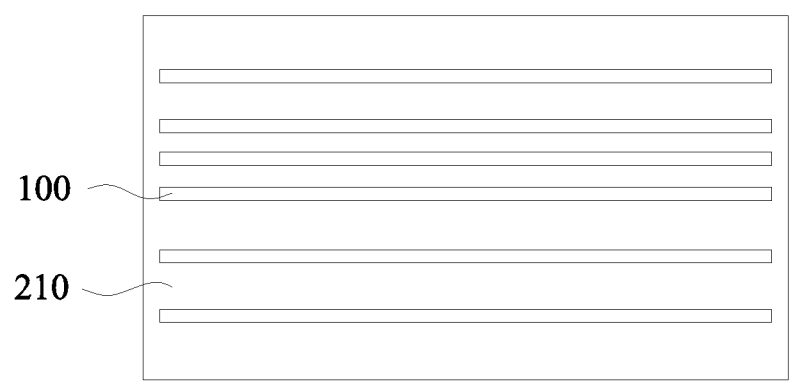
FIG. 2B illustrates one of the various stages of a sequential fabrication process of CNT gate structures in accordance with embodiments of the present disclosure.

In FIGS. 2A and 2B, one or more CNTs 100 are arranged over a substrate 200. In some embodiments, an intermediate layer 210 is formed on the substrate 200 and the CNTs 100 are disposed on the intermediate layer 201. The substrate 200 is a Si substrate (or a wafer) in some embodiments. The intermediate layer 210 is made of one or more of $SiO_2$, SiN, SiON, or any other suitable materials. In certain embodiments, SiN is used as the intermediate layer 210.

Carbon nanotubes can be formed by various methods, such as arc-discharge or laser ablation methods. The formed CNTs are dispersed in a solvent, such as sodium dodecyl sulfate (SDS). The CNTs can be transferred to and disposed on a substrate using various methods, such as a floating evaporative self-assembly method described in "Dose-controlled, floating evaporative self-assembly and alignment of semiconducting carbon nanotubes from organic solvent" (Y. Joo et al., Langmuir 30, 2460-3466 (2014)) or "Quasi-ballistic carbon nanotube array transistors with current density exceeding Si and GaAs" (G. J. Brady et al., Sci. Adv. 2106, 2-e1601240, September, 2016), the entire contents of each of which are incorporated herein by reference. Other methods described by "Arrays of single-walled carbon nanotubes with full surface coverage for high-performance electronics" (Q. Cao et al., Nature Nanotecnology, Vol. 7, December 2012) or "High-Performance Carbon Nanotube Field-Effect Transistors" (M. Shulaker et al., IEDM 2014), can also be employed.

Figure 2C:
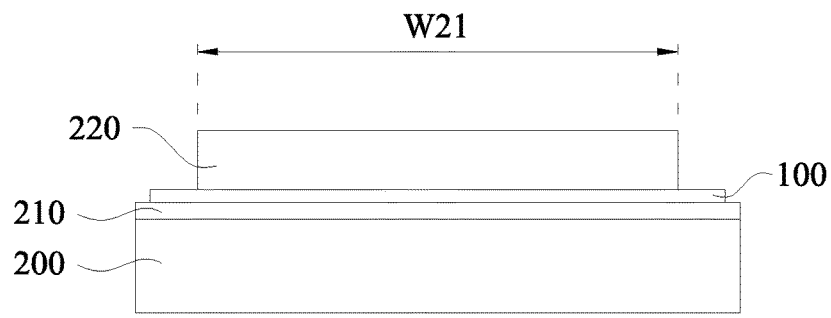
FIG. 2C illustrates one of the various stages of a sequential fabrication process of CNT gate structures in accordance with embodiments of the present disclosure.
Figure 2D:
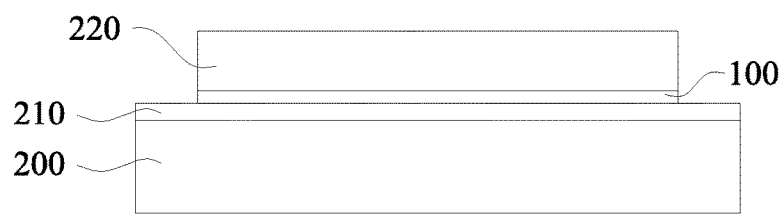
FIG. 2D illustrates one of the various stages of a sequential fabrication process of CNT gate structures in accordance with embodiments of the present disclosure.
Figure 2E:
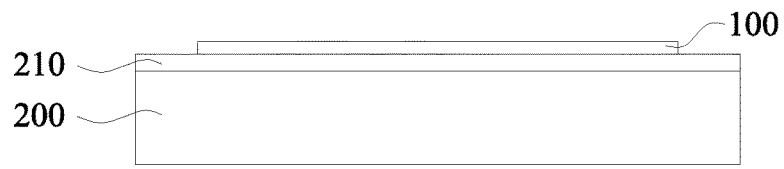
FIG. 2E illustrates one of the various stages of a sequential fabrication process of CNT gate structures in accordance with embodiments of the present disclosure.
Figure 2F:
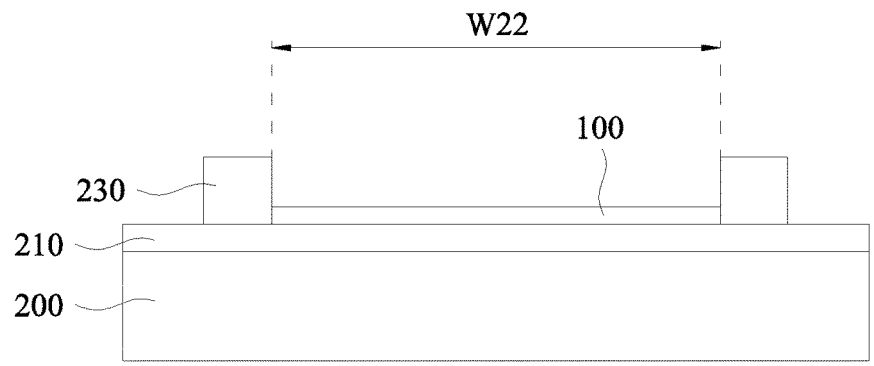
FIG. 2F illustrates one of the various stages of a sequential fabrication process of CNT gate structures in accordance with embodiments of the present disclosure.

After the CNTs 100 are transferred onto the intermediate layer 210, by using a lithography operation, a photo resist pattern 220, as a cover layer, is formed over a center part of the CNTs 100 disposed over the substrate 200. End portions of the CNT 100 are exposed, as shown in FIG. 2C. The width W21 of the photo resist pattern 220 is in a range from about 50 nm to about 2000 nm in some embodiments, and is in a range from about 100 nm to about 1000 nm in other embodiments. Then, the exposed end portions of the CNT 100 are removed by etching, as shown in FIG. 2D. Further, as shown in FIG. 2E, the resist pattern 220 is then removed by dry etching and/or wet removal using an organic solvent.

Subsequently, anchor structures 230 are formed on both ends of the CNTs. The anchor structure 230 is made of one or more of $SiO_2$, SiN, SiON, or any other suitable materials. In certain embodiments, SiN is used for the anchor structures 230. In certain embodiments, the anchor structure 230 and the intermediate layer 210 are made of the same material, and in other embodiments, the anchor structure 230 and the intermediate layer 210 are made of different materials. A blanket layer of the material for the anchor structure 230 is formed by, for example, chemical vapor deposition (CVD), physical vapor deposition (PVD) or atomic layer deposition (ALD). By using lithography and etching operations on the blanket layer, the anchor structures 230 are formed. End portions of about 50 nm to about 200 nm in length of the CNTs are covered by the anchor structures 230. In certain embodiments, the anchor structures 230 are formed at end portions of the CNTs 100 using different methods than those described. The width (space) W22 between the anchor structures 230 is in a range from about 50 nm to about 2000 nm in some embodiments, and is in a range from about 100 nm to about 1000 nm in other embodiments.

Figure 2G:
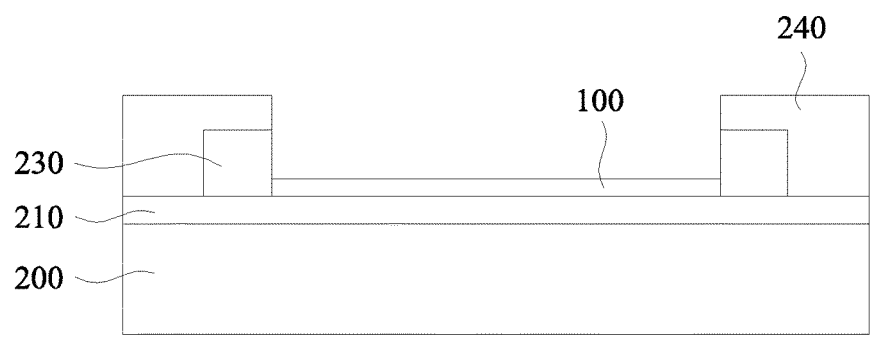
FIG. 2G illustrates one of the various stages of a sequential fabrication process of CNT gate structures in accordance with embodiments of the present disclosure.

Further, in some embodiments, photo resist patterns 240 are formed so as to expose the CNT 100 and to cover the anchor portions 230 and the remaining portions of the intermediate layer 210, as shown in FIG. 2G.

Figure 2H:
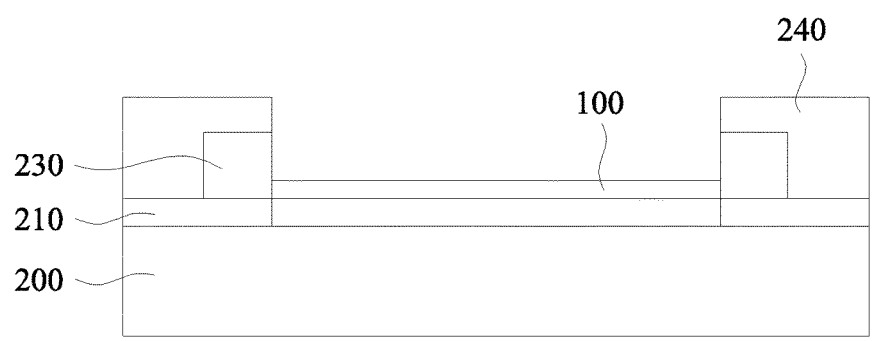
FIG. 2H illustrates one of the various stages of a sequential fabrication process of CNT gate structures in accordance with embodiments of the present disclosure.

Then, a part of the intermediate layer 210 under the CNT 100 is removed by a suitable etching operation, as shown in FIG. 2H. When the intermediate layer 210 is made of SiN, $H_3PO_4$ may be used as an etchant, and when the intermediate layer 210 is made of $SiO_2$, dilute HF or buffered HF may be used as an etchant. In some embodiments, dry etching can be employed to remove the intermediate layer 210.

Figure 2I:
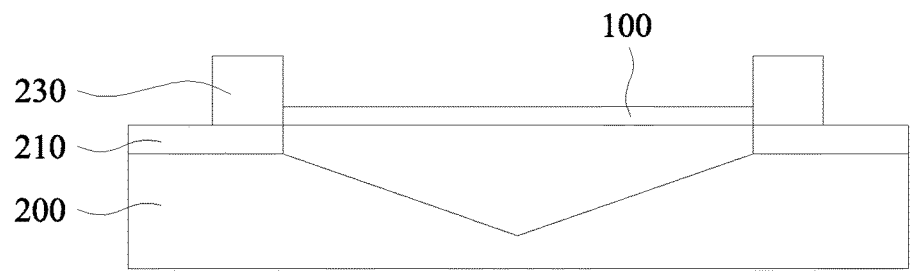
FIG. 2I illustrates one of the various stages of a sequential fabrication process of CNT gate structures in accordance with embodiments of the present disclosure.

The substrate 100 is subsequently recessed by a suitable etching operation, as shown in FIG. 2I. When the substrate 100 is a Si substrate, KOH and/or tetramethylammonium hydroxide (TMAH) can be used as an etchant. In some embodiments, dry etching can be employed to recess the substrate 100. Before or after recessing the substrate 100, the photo resist patterns 240 are removed.

Figure 2J:
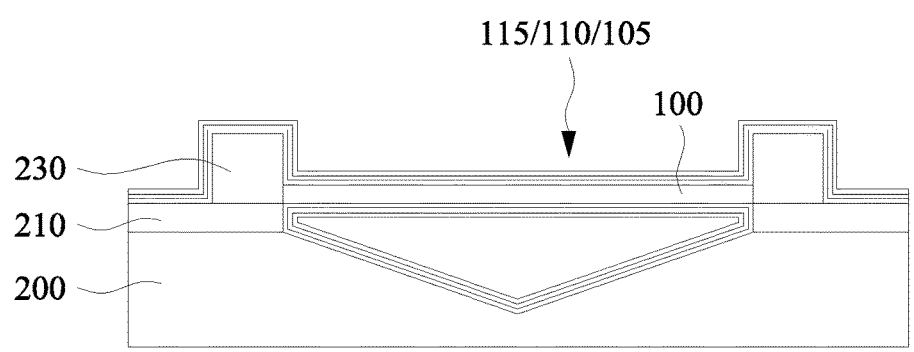
FIG. 2J illustrates one of the various stages of a sequential fabrication process of CNT gate structures in accordance with embodiments of the present disclosure.

After the substrate 100 is recessed, an interfacial layer 105 is formed to wrap around the CNT. The interfacial layer 105 can be formed by CVD, PVD or ALD, or any other suitable film formation methods. Further, a gate dielectric layer 110 is subsequently formed to wrap around the CNT 100 wrapped with the interfacial layer 105. The gate dielectric layer 110 can be formed by CVD, PVD or ALD, or any other suitable film formation methods. Subsequently, a gate electrode layer 115 is formed to wrap around the CNT 100 wrapped with the interfacial layer 105 and the gate dielectric layer 110. The gate electrode layer 115 can be formed by CVD, PVD, ALD, electroplating or any other suitable film formation methods. As shown in FIG. 2J, the interfacial layer 105, the gate dielectric layer 110 and/or the gate electrode layer 115 are also deposited on the anchor portions 230 and/or the intermediate layer 210 in some embodiments.

Then, the CNT 100 with the interfacial layer 105, the gate dielectric layer 100 and gate electrode layer 115 is separated from the substrate 100, to obtain the CNT structures 120. In some embodiments, a mechanical force is applied to remove the CNT structures 120 from the substrate, as shown in FIGS. 2K to 2M.

Figure 2K:
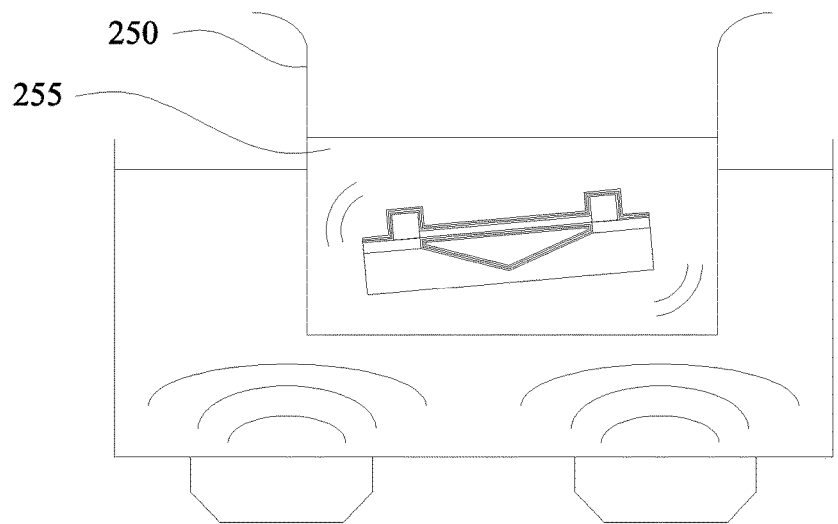
FIG. 2K illustrates one of the various stages of a sequential fabrication process of CNT gate structures in accordance with embodiments of the present disclosure.

As shown in FIG. 2K, the substrate 200 on which the CNT 100 is formed with the interfacial layer 105, the gate dielectric layer 100 and gate electrode layer 115 is dipped into a liquid 255, such as water or an organic solvent, in a vessel 250. In some embodiments, SDS is used as the liquid 255. The vessel 250 is then placed in water and ultrasonic waves are applied, as shown in FIG. 2K.

Figure 2L:
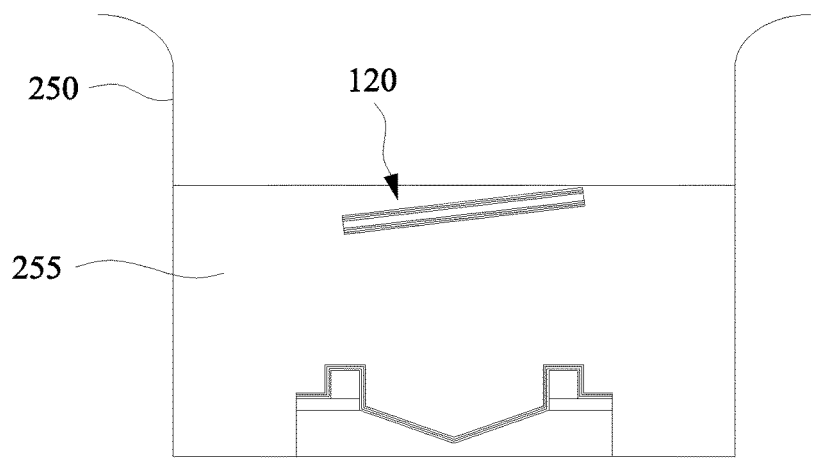
FIG. 2L illustrates one of the various stages of a sequential fabrication process of CNT gate structures in accordance with embodiments of the present disclosure.
Figure 2M:
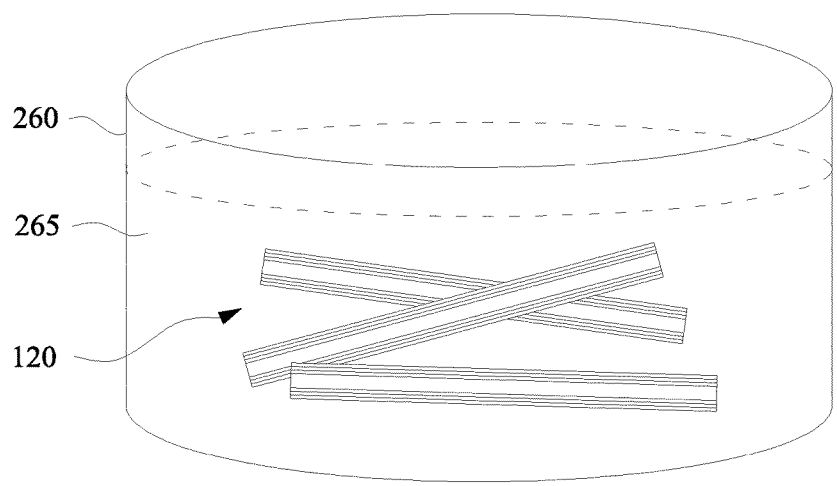
FIG. 2M illustrates one of the various stages of a sequential fabrication process of CNT gate structures in accordance with embodiments of the present disclosure.

By the force of the ultrasonic waves, the CNT structures 120 are detached from the substrate 200, as shown in FIG. 2L. After that, the substrate 200 is removed from the liquid 255, thereby leaving the CNT structures 120 in the liquid 255, or the liquid 255 with the CNT structures 120 is transferred to another container 260, as shown in FIG. 2M. The liquid 255 may be replaced with a new fresh liquid 265, which may be the same composition as or different composition from the liquid 255, in the vessel 250 or the another container 260. With the foregoing operations, it is possible to obtain "pre-fabricated" CNT gate structures 120, having substantially the same length (e.g., 50 nm to 2000 nm or 100 nm to 1000 nm). The variation (36) of the length is less than about 5% of the average length of the CNT structures 120. Since each of the CNT gate structures 120 is covered by the gate electrode and the underlying layers, there is no direct interaction or contact between CNTs 100, which can prevent inter-tube interactions that degrade CNT performance in a CNT bundle structure FIGS. 3A-3K illustrate various stages of a sequential fabrication process of a GAA FET in accordance with embodiments of the present disclosure. It is understood that additional operations can be provided before, during, and after the processes shown by FIGS. 3A-3K, and some of the operations described below can be replaced or eliminated, for additional embodiments of the method. The order of the operations/processes may be interchangeable. Materials, configurations, dimensions, processes and/or operations the same as or similar to those described with respect to FIGS. 1A-2M may be employed in the following embodiments and the detailed explanation may be omitted.

Figure 3A:
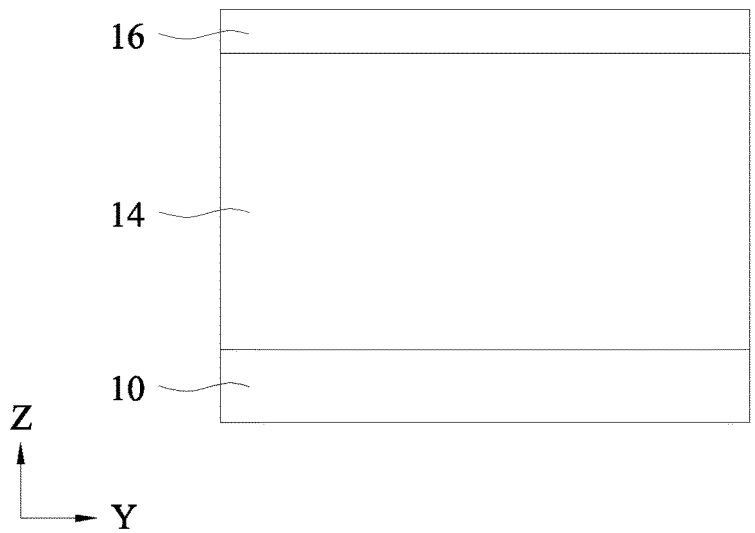
FIG. 3A illustrates one of the various stages of a sequential fabrication process of a GAA FET in accordance with embodiments of the present disclosure.

As shown in FIG. 3A, a first insulating layer 14, for example, an $SiO_2$ layer, is formed over a substrate 10. The first insulating layer 14 can be formed by thermal oxidation or CVD. Further, a second insulating layer 16, for example an SiN layer, is formed over the first insulating layer 14. The second insulating layer 16 can be formed by CVD, PVD or ALD. The thickness of the first insulating layer 14 is in a range from about 15 nm to about 150 nm in some embodiments, and is in a range from about 30 nm to about 70 nm in other embodiments. The thickness of the second insulating layer 16 is in a range from about 5 nm to about 50 nm in some embodiments, and is in a range from about 10 nm to about 30 nm in other embodiments.

Figure 3B:
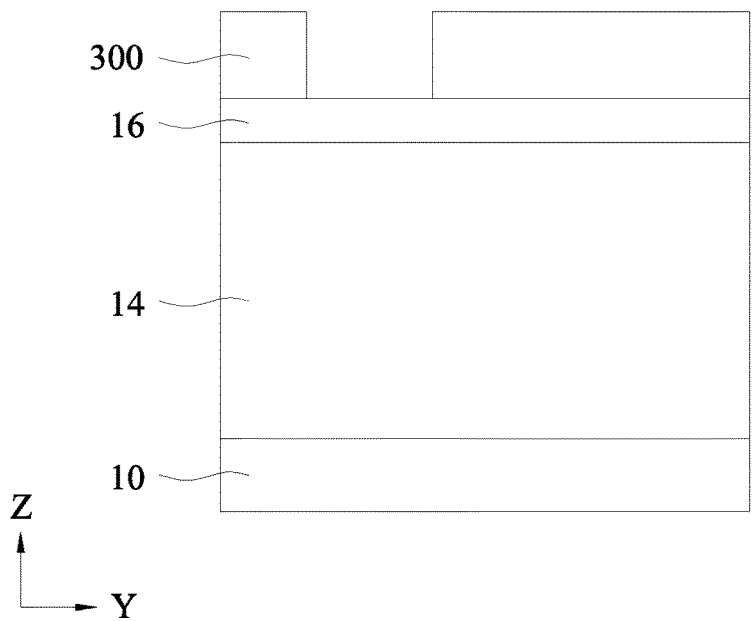
FIG. 3B illustrates one of the various stages of a sequential fabrication process of a GAA FET in accordance with embodiments of the present disclosure.

Then, as shown in FIG. 3B, a first mask pattern 300 is formed over the second insulating layer 16. In some embodiments, the first mask pattern 300 is made of a photo resist formed by a lithography operation, and is a hard mask pattern in other embodiments.

Figure 3C:
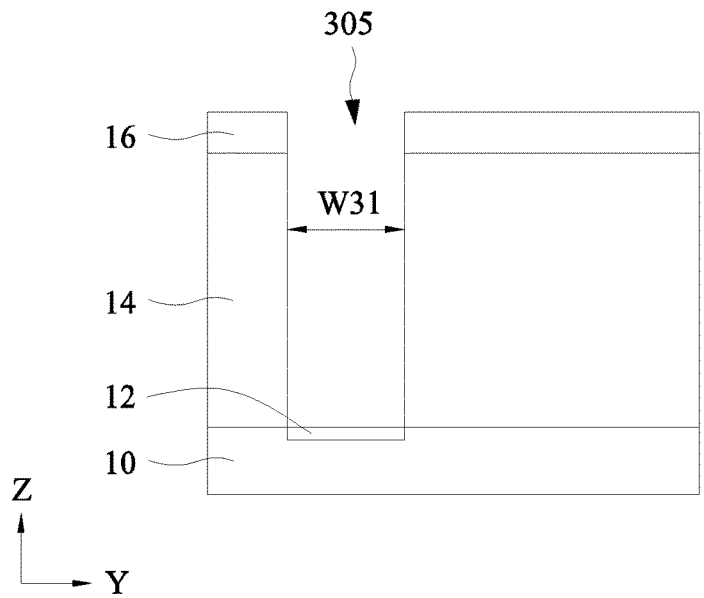
FIG. 3C illustrates one of the various stages of a sequential fabrication process of a GAA FET in accordance with embodiments of the present disclosure.

By using the mask pattern 300 as an etching mask, the first and second insulating layers are trench etched to form a trench 305, as shown in FIG. 3C. The width W31 of the trench 305 is in a range from about 10 nm to about 100 nm in some embodiments, and is in a range from about 20 nm to about 50 nm in other embodiments. After the trench etching, the first mask pattern 300 is removed. In some embodiments, multiple trenches may be formed over the substrate 10. In the present embodiment, only one trench is illustrated for explanation purposes.

In some embodiments, an insulating liner layer 12 made of, for example $SiO_2$, is optionally formed at the bottom of the trench on the substrate 10. The liner layer 12 can be formed by adjusting an etching time in the trench etching of the first insulating layer so as to leave a thin layer of the first insulating layer 14 as the insulating liner layer 12, in some embodiments. The liner layer 12 can be formed by thermal oxidation of the substrate 10 or other suitable film forming methods in other embodiments. The liner layer 12 may be omitted in some of the figures for simplicity.

In some embodiments, the substrate 10 has a surface insulating layer, and the first insulating layer 14 is formed on the surface insulating layer. In such a case, the surface insulating layer is exposed at the bottom of the trench and used as the insulating liner layer 12. The surface insulating layer may be $SiO_2$, SiN, SiON or any other suitable insulating materials.

Figure 3D:
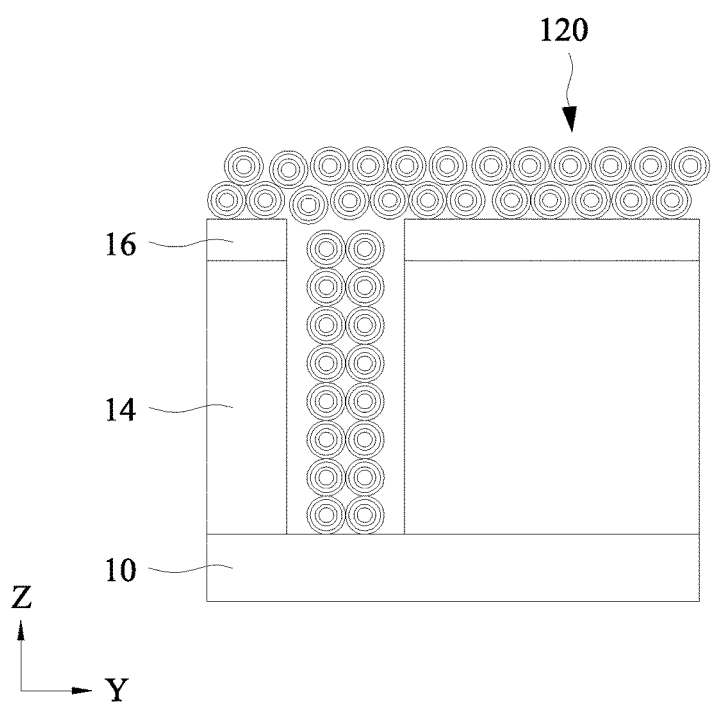
FIG. 3D illustrates one of the various stages of a sequential fabrication process of a GAA FET in accordance with embodiments of the present disclosure.

After the trench 305 is formed, CNT structures 120 are disposed in the trench and over the second insulating layer 16, as shown in FIG. 3D. As set forth above, CNT structures 120 are prepared and dispersed in the liquid 255 or 265. The liquid with CNT structure 120 is dispensed and spin-coated on the substrate 10 with the trench 305. After a few hours, the CNT structures 120 are deposited in the trench 305 by gravity. Then, the liquid (solvent) is removed by evaporation or blowing air, thereby leaving the CNT structures 120 as shown in FIG. 3D.

In some embodiments, the inner walls (sidewalls and the bottom wall) of the trench 305 are surface-treated with an appropriate material to enhance selective deposition of the CNT structures 120 in the trench. The surface-treatment can make the inner walls hydrophobic in some embodiments.

In some embodiments, a selective placement method is performed. The selective placement method is based on ion exchange between a functional surface monolayer and surfactant wrapping the carbon nanotubes in aqueous solution. Strong electrostatic interaction between the surface monolayer and the nanotube surfactant leads to the placement of individual nanotubes with excellent selectivity. The surface monolayer is formed from, for example, 4-(N-hydroxycarboxamido)-1-methylpyridinium iodide (NMPI) molecules, which were synthesized from commercially available methyl isonicotinate. The monolayer contains a hydroxamic acid end group that is known to self-assemble on a metal oxide layer, which can be used as liner layer 12. The anion of NMPI (that is, iodide) is exchanged with the anionic surfactant wrapping around the CNT structures (an anionic surfactant sodium dodecyl sulphate, SDS), leading to a strong coulombic attraction between the negatively charged surfactant and the positively charged monolayer. By this method, the CNT structures 120 can be disposed in the trench.

Figure 3E:
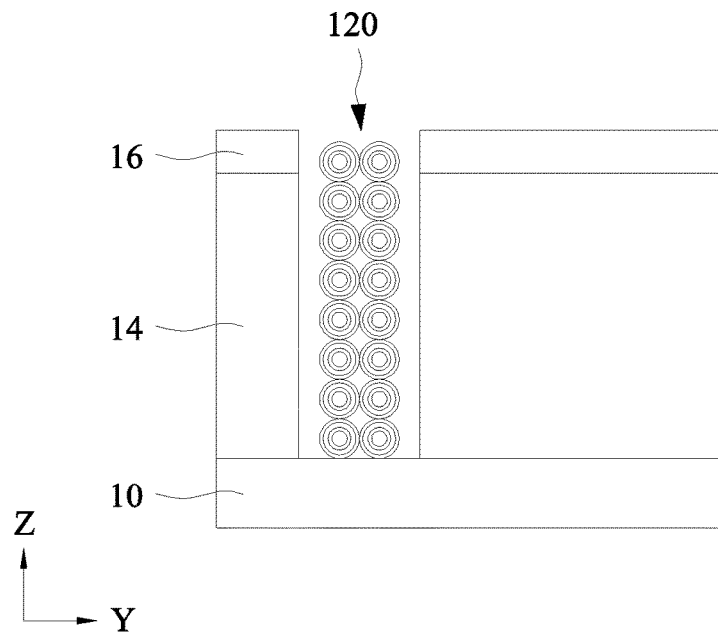
FIG. 3E illustrates one of the various stages of a sequential fabrication process of a GAA FET in accordance with embodiments of the present disclosure.
Figure 3F:
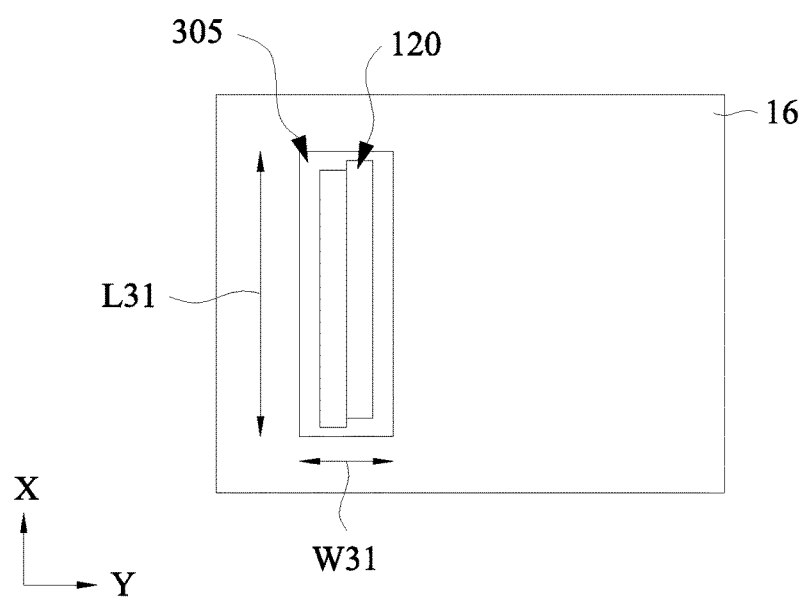
FIG. 3F illustrates one of the various stages of a sequential fabrication process of a GAA FET in accordance with embodiments of the present disclosure.

Next, as shown in FIG. 3E, a planarization operation, such as an etch back operation or a chemical mechanical polishing (CMP) operation, is performed, thereby removing the CNT structures 120 disposed on the upper surface of the second insulating layer 16, as shown in FIGS. 3E and 3F. FIG. 3F is a plan (top) view of FIG. 3E. Since the length L31 in the X direction of the trench is adjusted to be slightly larger than the length of the CNT structures 120, for example, about 1.05-1.2 times the length of the CNT structures 120, the CNT structures 120 can be arranged as shown in FIGS. 3E and 3F.

Figure 3G:
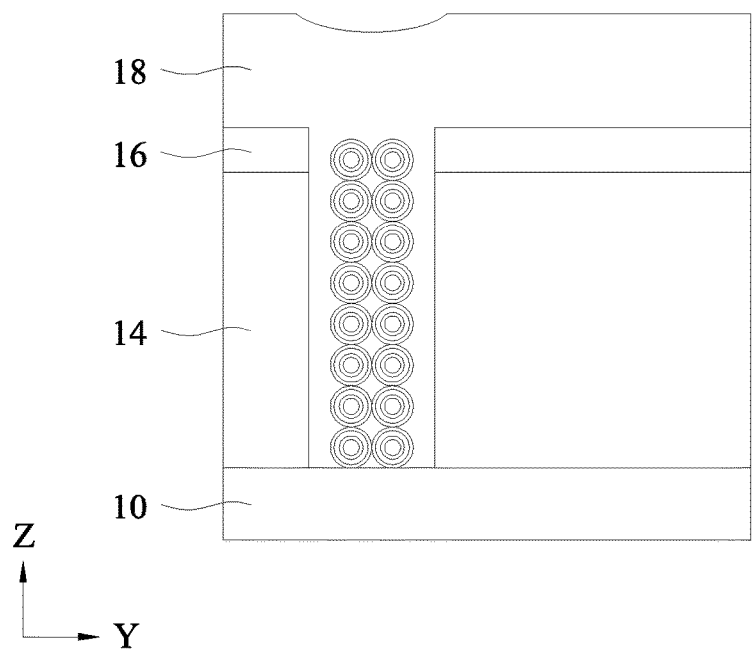
FIG. 3G illustrates one of the various stages of a sequential fabrication process of a GAA FET in accordance with embodiments of the present disclosure.
Figure 3H:
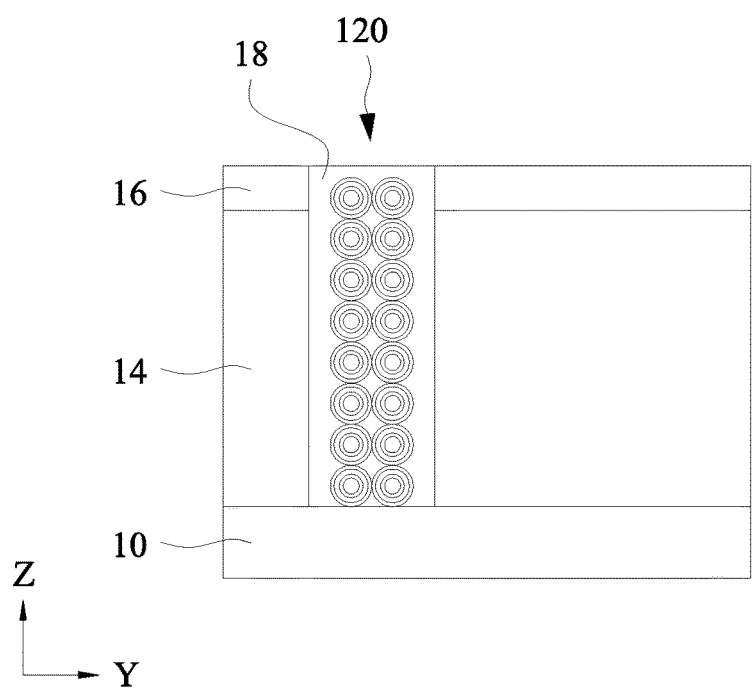
FIG. 3H illustrates one of the various stages of a sequential fabrication process of a GAA FET in accordance with embodiments of the present disclosure.

Subsequently, an anchor layer 18 is deposited around the CNT structures 120 inside the trench 305 and over the second insulating layer 16, as shown in FIG. 3G, and a planarization operation, such as an etch back operation or a CMP operation, is performed to remove excess material of the anchor layer 18, as shown in FIG. 3H. The anchor layer 18 can be formed by CVD, PVD or ALD or any other suitable film formation methods. In some embodiments, the second insulating layer 16 can function as an etch-stop layer in the CMP operation, and in other embodiments, the second insulating layer 16 is removed by the CMP.

Figure 3I:
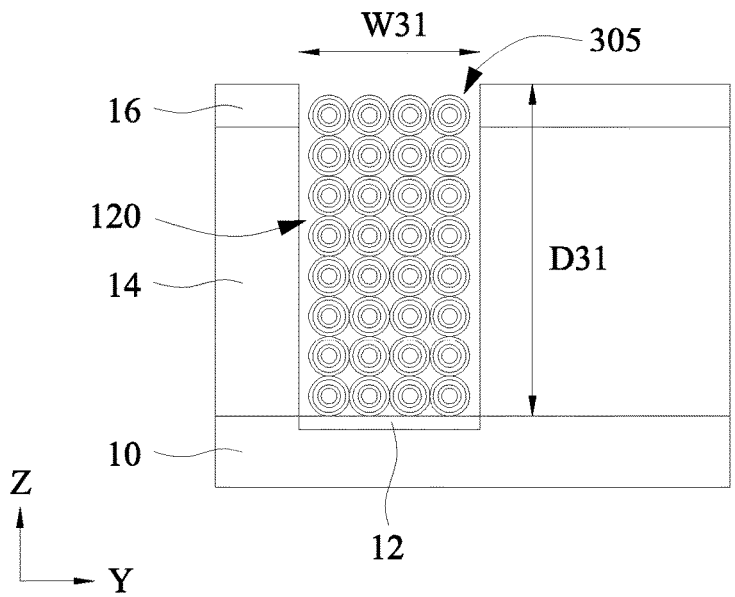
FIG. 3I illustrates one of the various arrangements of CNT gate structures in a trench in accordance with various embodiments of the present disclosure.
Figure 3J:
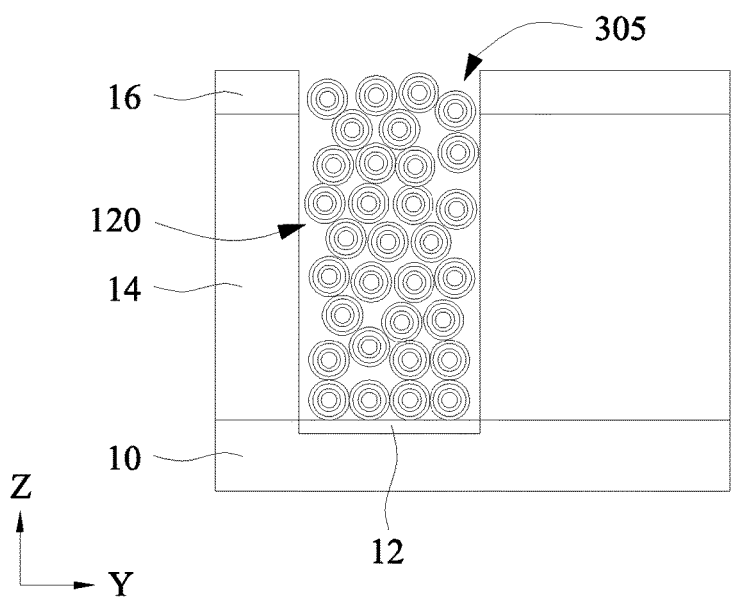
FIG. 3J illustrates one of the various arrangements of CNT gate structures in a trench in accordance with various embodiments of the present disclosure.
Figure 3K:
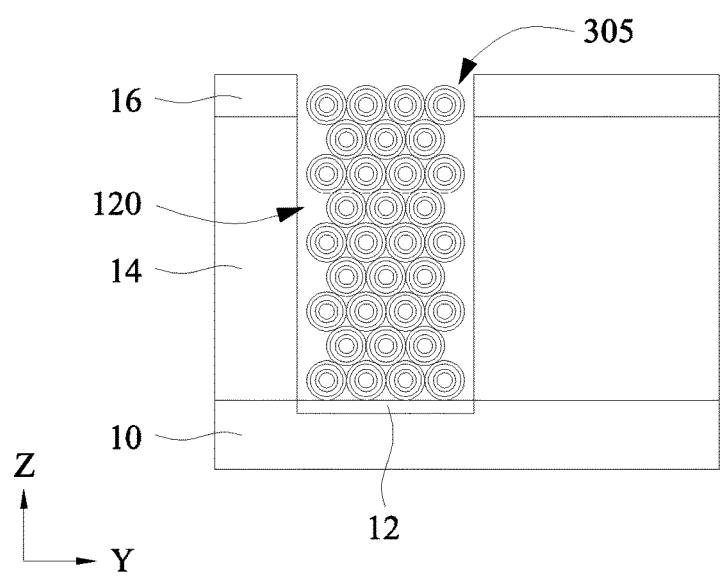
FIG. 3K illustrates one of the various arrangements of CNT gate structures in a trench in accordance with various embodiments of the present disclosure.

FIGS. 3I, 3J and 3K illustrate various arrangements of the CNT structures 120 in a trench in accordance with various embodiments of the present disclosure.

In FIG. 3I, the CNT structures 120 are arranged in the trench to form a matrix in the X-Y cross section. One of the CNT structures 120 located in the center portion in the X-Y cross section is in contact with four adjacent CNT structures 120.

In FIG. 3K, the CNT structures 120 are arranged in the trench to form a closely packed state (hexagonal close-packed structure) in the X-Y cross section. One of the CNT structures 120 located in the center portion in the X-Y cross section is in contact with six adjacent CNT structures 120.

In FIG. 3J, the CNT structures 120 are randomly arranged in the trench. One of the CNT structures 120 may be in contact with no adjacent CNT structure 120, and another of the CNT structures 120 may be in contact with 1, 2, 3, 4, 5 and/or 6 adjacent CNT structures 120.

In any of FIGS. 3I-3J, the total number of the CNT structures 120 per trench is in a range from about 20 to about 200 in some embodiments.

Figure 4A:
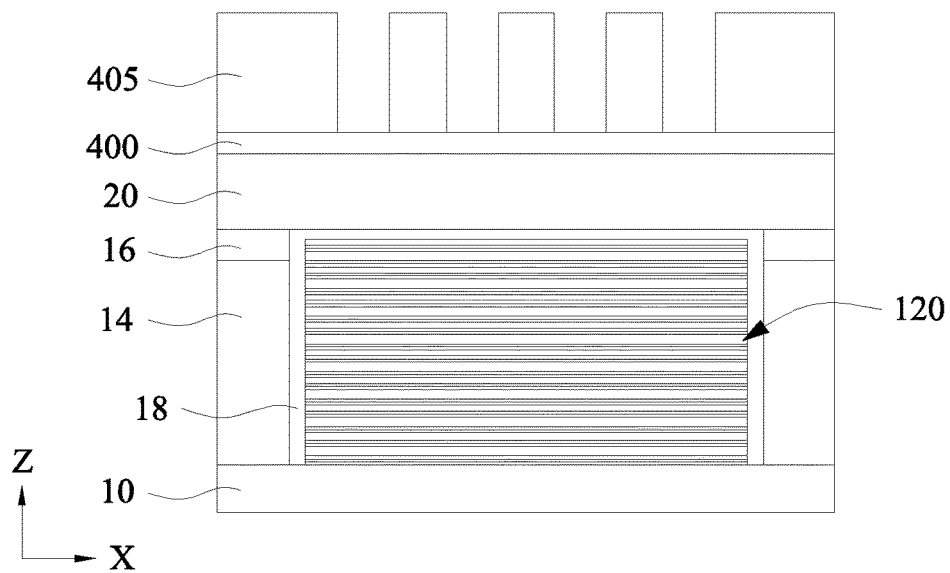
FIG. 4A illustrates one of the various stages of a sequential fabrication process of a GAA FET in accordance with embodiments of the present disclosure.
Figure 4B:
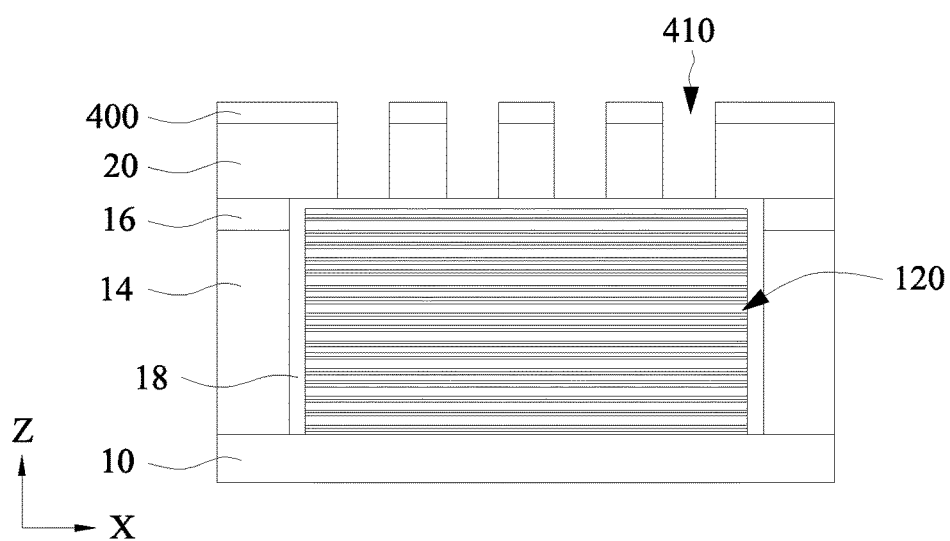
FIG. 4B illustrates one of the various stages of a sequential fabrication process of a GAA FET in accordance with embodiments of the present disclosure.
Figure 4C:
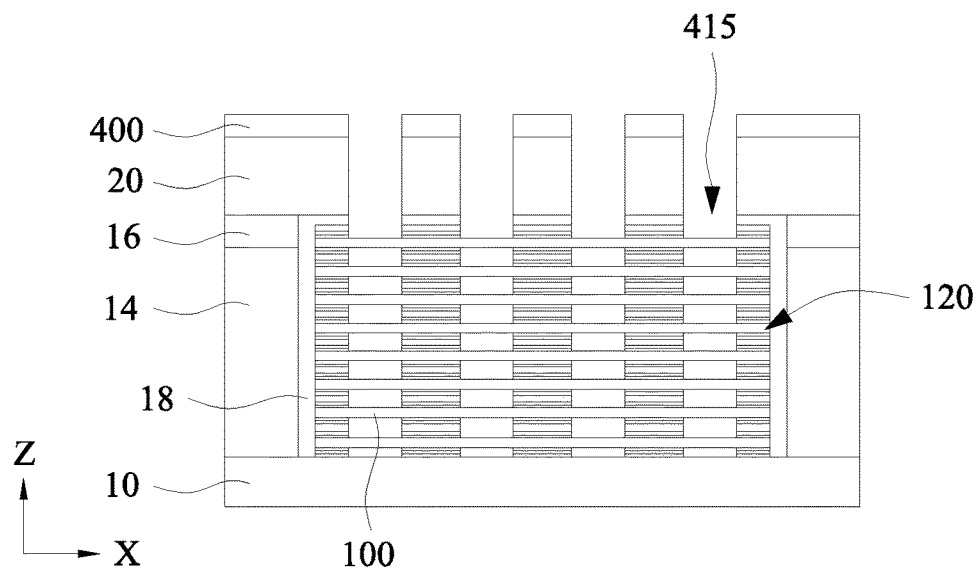
FIG. 4C illustrates one of the various stages of a sequential fabrication process of a GAA FET in accordance with embodiments of the present disclosure.
Figure 4D:
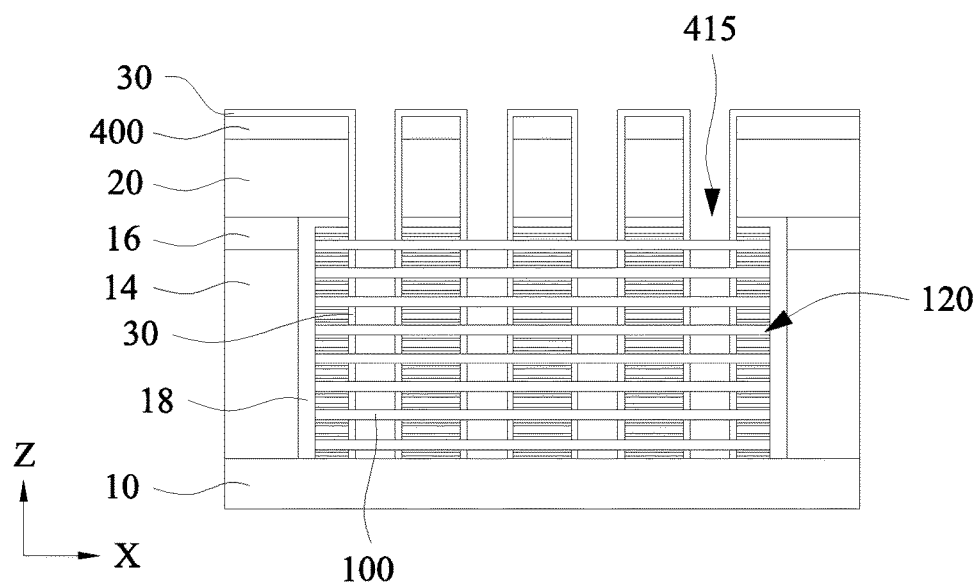
FIG. 4D illustrates one of the various stages of a sequential fabrication process of a GAA FET in accordance with embodiments of the present disclosure.
Figure 4E:
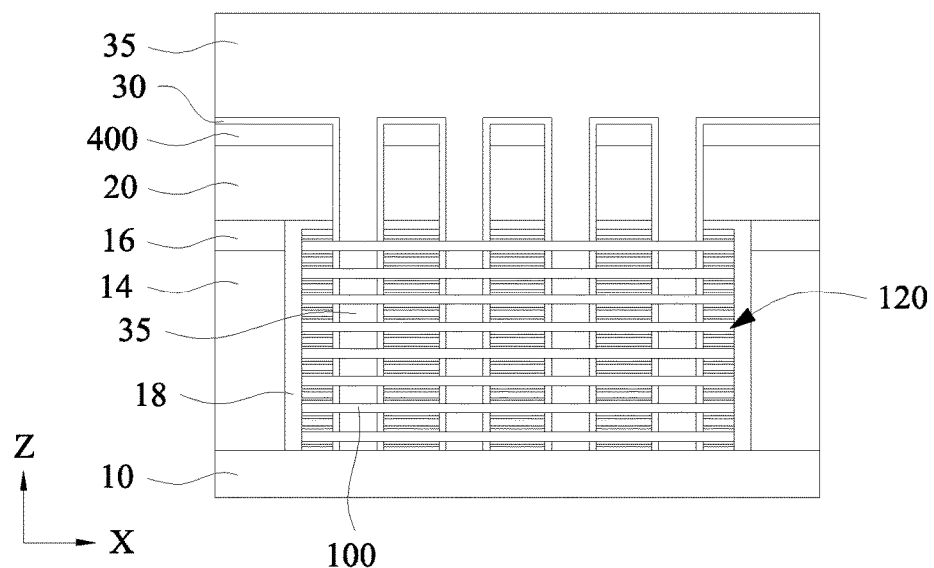
FIG. 4E illustrates one of the various stages of a sequential fabrication process of a GAA FET in accordance with embodiments of the present disclosure.
Figure 4F:
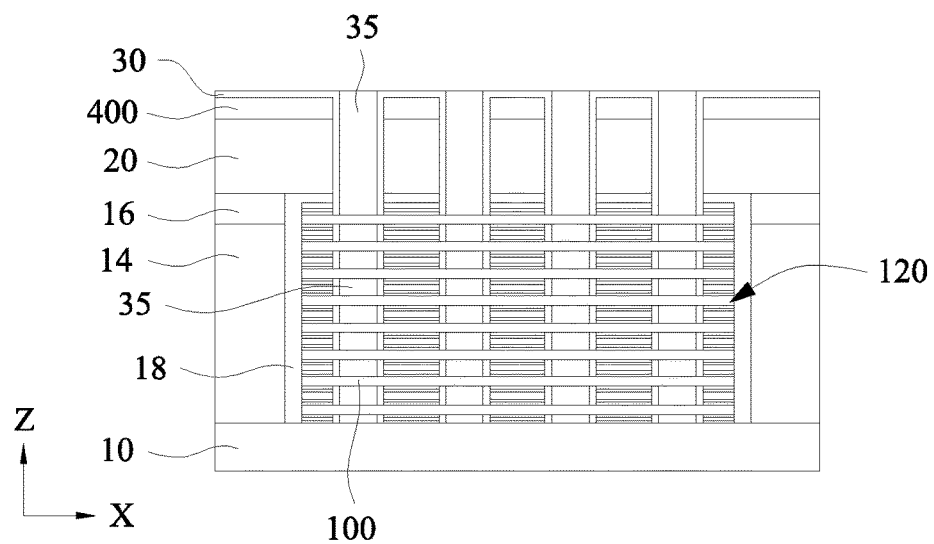
FIG. 4F illustrates one of the various stages of a sequential fabrication process of a GAA FET in accordance with embodiments of the present disclosure.
Figure 4G:
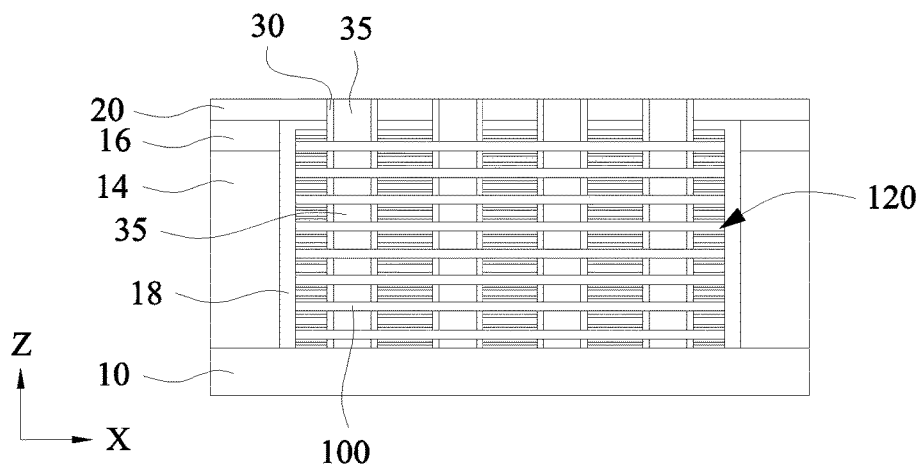
FIG. 4G illustrates one of the various stages of a sequential fabrication process of a GAA FET in accordance with embodiments of the present disclosure.
Figure 4H:
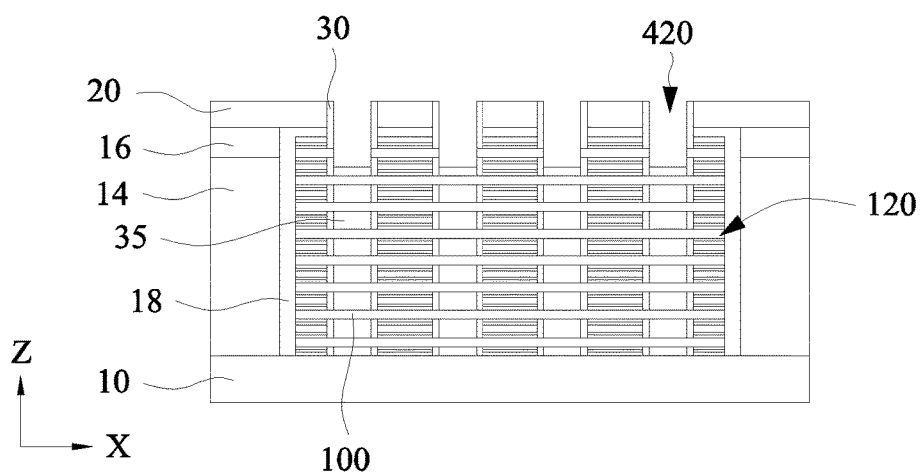
FIG. 4H illustrates one of the various stages of a sequential fabrication process of a GAA FET in accordance with embodiments of the present disclosure.
Figure 4I:
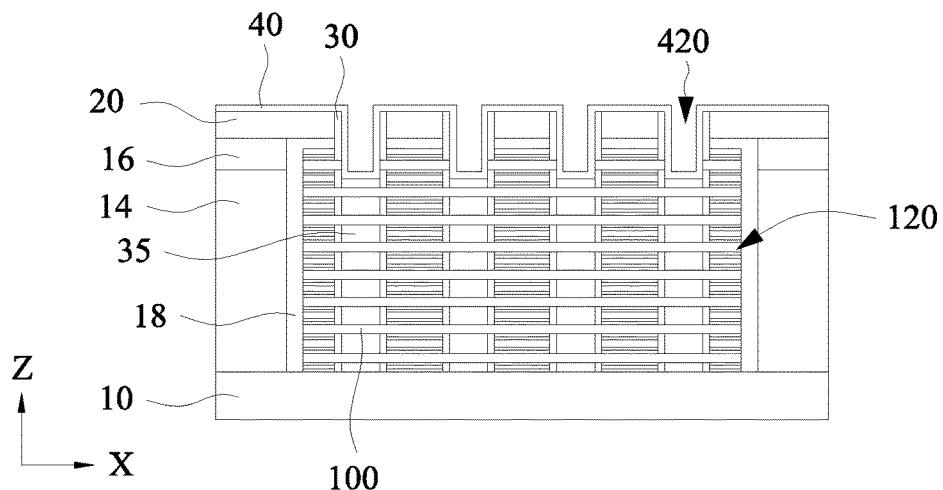
FIG. 4I illustrates one of the various stages of a sequential fabrication process of a GAA FET in accordance with embodiments of the present disclosure.
Figure 4J:
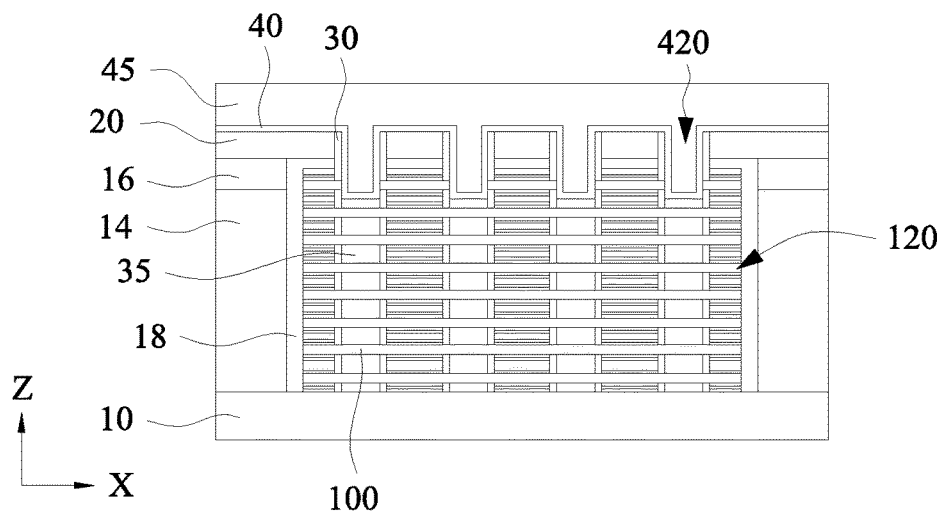
FIG. 4J illustrates one of the various stages of a sequential fabrication process of a GAA FET in accordance with embodiments of the present disclosure.
Figure 4K:
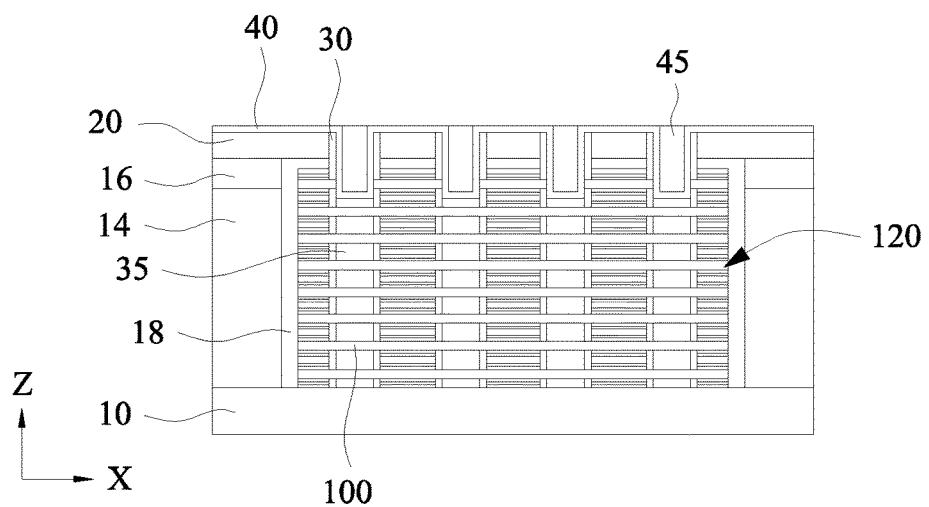
FIG. 4K illustrates one of the various stages of a sequential fabrication process of a GAA FET in accordance with embodiments of the present disclosure.
Figure 4L:
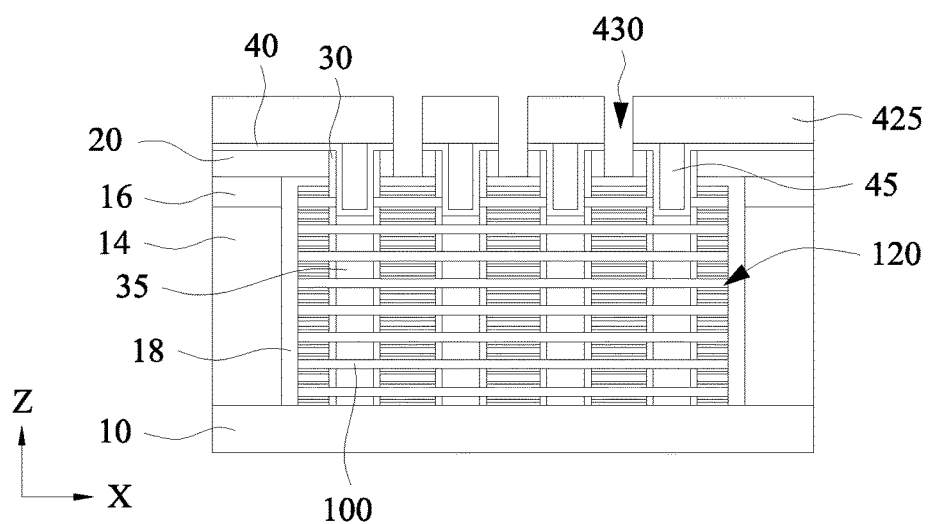
FIG. 4L illustrates one of the various stages of a sequential fabrication process of a GAA FET in accordance with embodiments of the present disclosure.
Figure 4M:
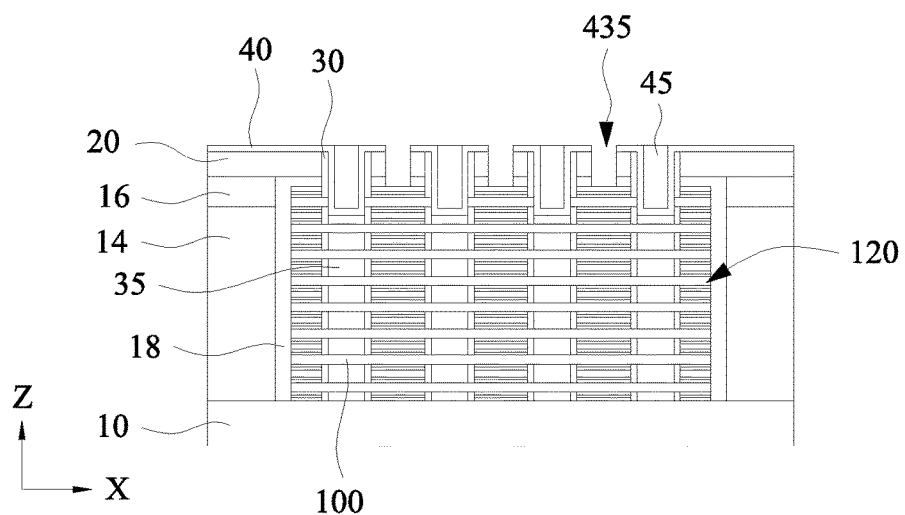
FIG. 4M illustrates one of the various stages of a sequential fabrication process of a GAA FET in accordance with embodiments of the present disclosure.
Figure 4N:
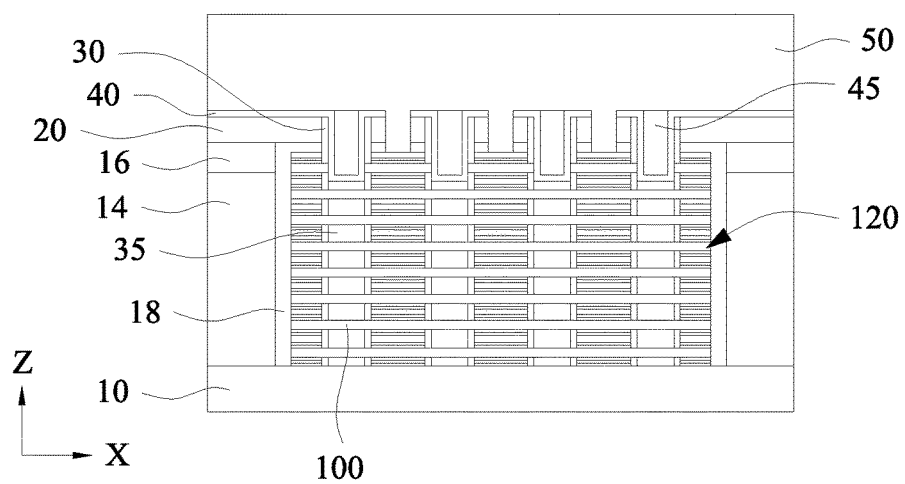
FIG. 4N illustrates one of the various stages of a sequential fabrication process of a GAA FET in accordance with embodiments of the present disclosure.
Figure 4O:
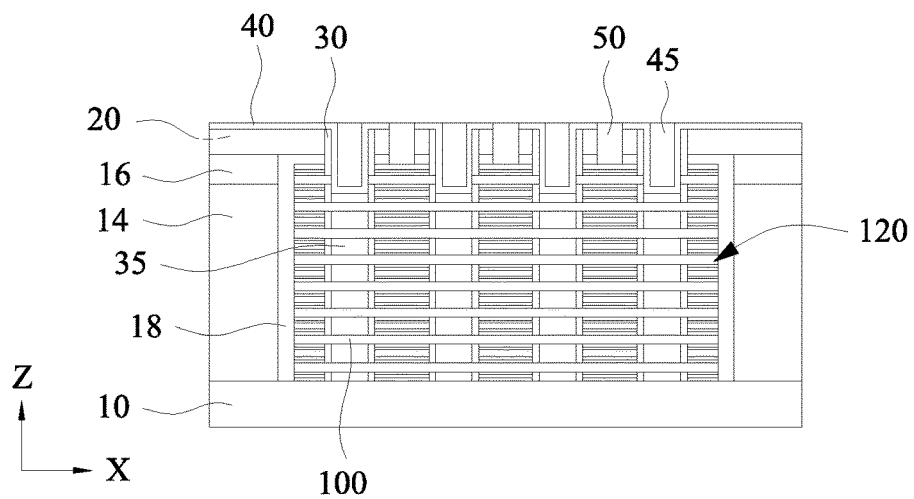
FIG. 4O illustrates one of the various stages of a sequential fabrication process of a GAA FET in accordance with embodiments of the present disclosure.
Figure 4P:
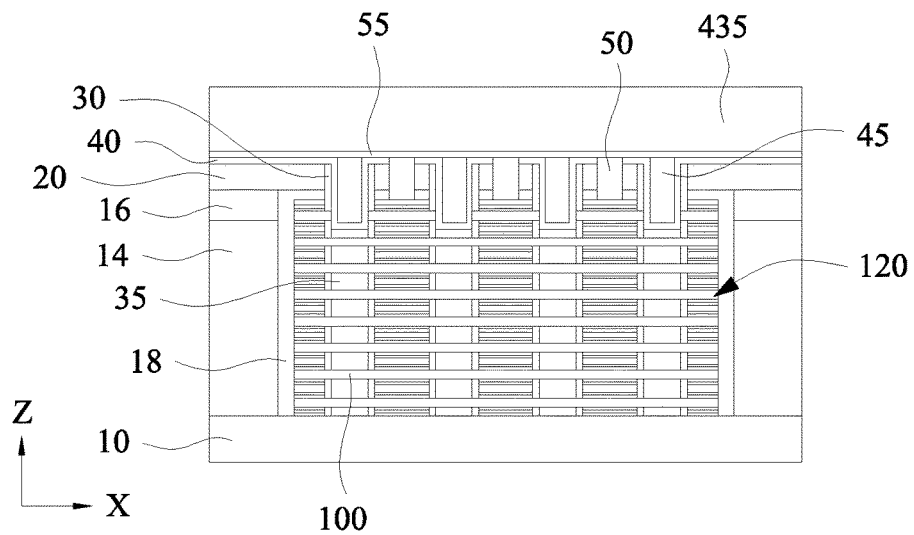
FIG. 4P illustrates one of the various stages of a sequential fabrication process of a GAA FET in accordance with embodiments of the present disclosure.
Figure 4Q:
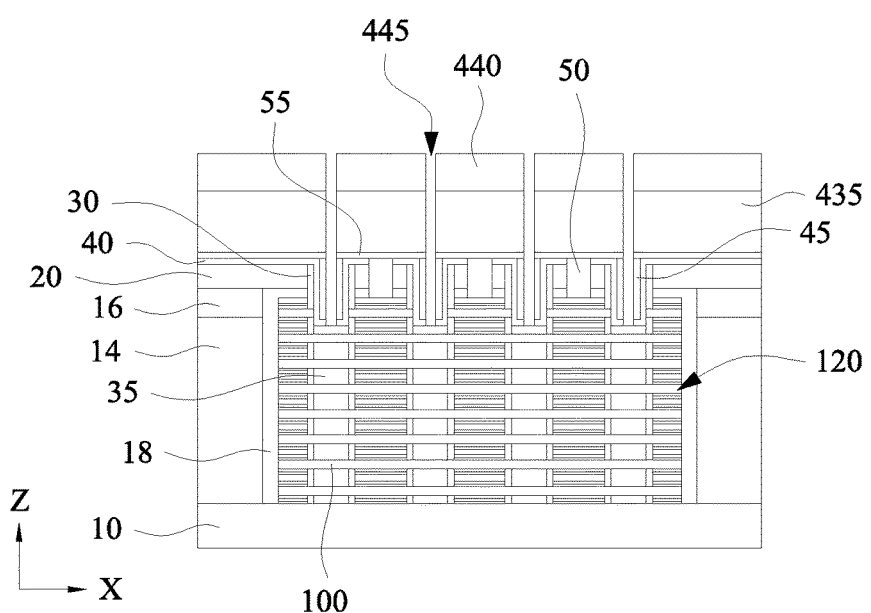
FIG. 4Q illustrates one of the various stages of a sequential fabrication process of a GAA FET in accordance with embodiments of the present disclosure.
Figure 4R:
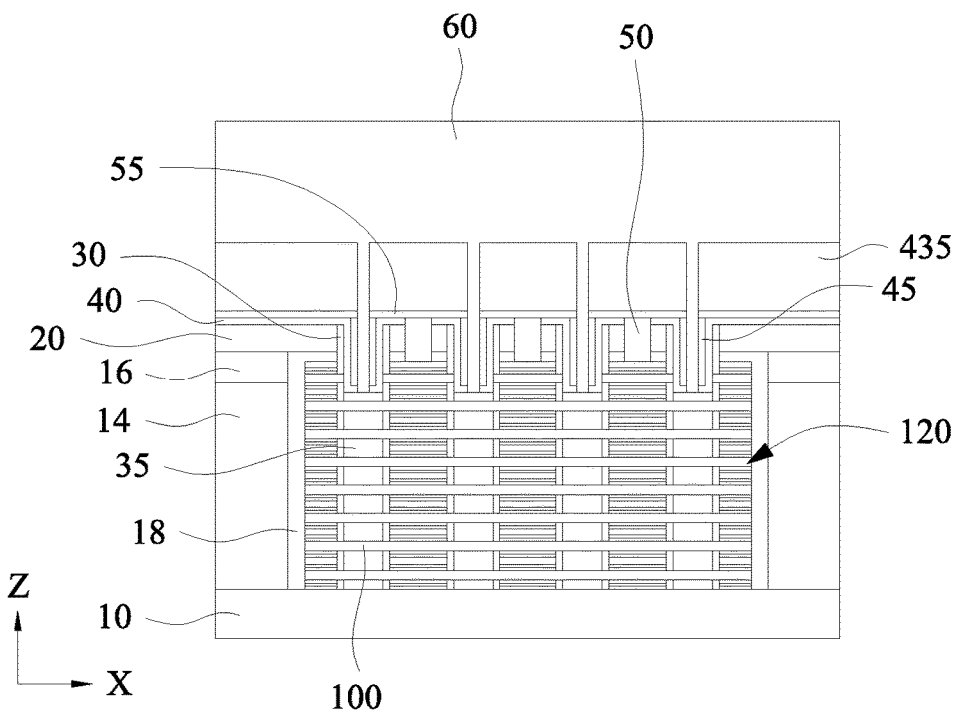
FIG. 4R illustrates one of the various stages of a sequential fabrication process of a GAA FET in accordance with embodiments of the present disclosure.
Figure 4S:
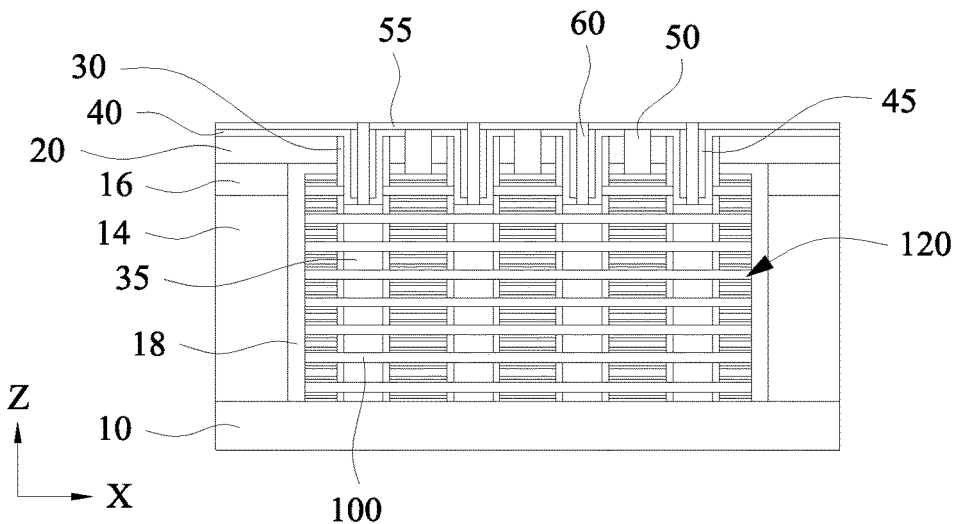
FIG. 4S illustrate one of the various stages of a sequential fabrication process of a GAA FET in accordance with embodiments of the present disclosure.

FIGS. 4A-4S illustrate various stages of a sequential fabrication process of a GAA FET in accordance with embodiments of the present disclosure. It is understood that additional operations can be provided before, during, and after processes shown by FIGS. 4A-4S, and some of the operations described below can be replaced or eliminated, for additional embodiments of the method. The order of the operations/processes may be interchangeable. Materials, configurations, dimensions, processes and/or operations the same as or similar to those described with respect to FIGS. 1A-3K may be employed in the following embodiments and the detailed explanation may be omitted.

After the structure of FIG. 3H is formed, a third insulating layer 20 is formed over the structure of FIG. 3H. The third insulating layer 20 can be formed by CVD, PVD or ALD or any other suitable film forming methods. Further, a hard mask layer 400 is formed over the third insulating layer 20. The hard mask layer 400 is made of a silicon nitride based material, such as SiN, in some embodiments. The thickness of the third insulating layer 20 is in a range from about 10 nm to about 100 nm in some embodiments. The thickness of the hard mask layer 400 is in a range from about 5 nm to about 50 nm in some embodiments. Then, a mask pattern 405 is formed over the hard mask layer 400, as shown in FIG. 4A. The mask pattern 405 is a resist pattern formed by a lithography operation and has one or more openings corresponding to source/drain (S/D) regions.

Then, as shown in FIG. 4B, the hard mask layer 400 and the third insulating layer 20 are patterned by dry etching using the mask pattern 405 as an etching mask. Then, the mask pattern 405 is removed. By this etching, the anchor layer 18 is partially exposed.

Subsequently, the anchor layer 18 is etched by dry etching using the patterned hard mask layer 400 (and the patterned third insulating layer 20) as an etching mask to form S/D spaces 415, as shown in FIG. 4C. Further, the gate electrode layer 115, the gate dielectric layer 110 and the interfacial layer 105 of the CNT structure in the S/D region are removed by dry and/or wet etching, thereby the CNTs 100 are exposed in the S/D spaces 415. In some embodiments, the interfacial layer 105 is removed by gas-phase etching.

After the CNTs 100 are exposed in the S/D spaces 415, a first spacer layer 30 is selectively formed on side ends of the gate stack (the interfacial layer 105, the gate dielectric layer 110 and the gate electrode layer 115), as shown in FIG. 4D. A first spacer layer 30 is formed on sidewalls of the third insulating layer 20 and the hard mask layer 400, but is not substantially deposited on the exposed CNTs 100. The first spacer layer 30 can be formed by ALD. In some embodiments, since the surface of CNTs 100 is hydrophobic, in particular, having an ideal surface without dangling bonds, the surface of CNTs 100 does not absorb the oxidation precursor in the ALD processes, such $H_2O$. Thus, as shown in FIG. 4D, most of the CNTs 100 remain exposed.

Thereafter, an S/D electrode layer 35 is deposited in the S/D spaces and over the upper surface of the first spacer layer 30, as shown in FIG. 4E, and a planarization operation, such as CMP, is performed to remove excess material, as shown in FIG. 4F. The S/D electrode layer 35 can be formed by CVD, PVD, ALD, electroplating, or any other suitable conductive film forming method. Further, in some embodiments, one or more additional planarization operations, such as CMP, is performed to remove the upper portion of the first spacer layer 30, the hard mask layer 400 and a part of the third insulating layer 20 together with an upper portion of the S/D electrode layer 35, as shown in FIG. 4G. After this planarization operation(s), the thickness of the third insulating layer 20 above the second insulating layer 20 is in a range from about 10 nm to about 40 nm in some embodiments.

As shown in FIG. 4H, the upper portion of the S/D electrode layer 35 is further recessed by suitable etching to form a recess 420. In some embodiments, the CNT 100 of at least one of the CNT structures 120 arranged at the uppermost portion is also etched away, and thus pieces of CNTs that do not function as a GAA FET are formed.

Then, as shown in FIG. 4I, a first etch stop layer (ESL) 40 is formed on the recessed S/D electrode layer 35 and on the first spacer layer 30. Further, a fourth insulating layer 45 is formed on the first ESL 40 in and above the recess 420, as shown in FIG. 4J, and a planarization operation, such as CMP, is performed to remove excess material of the fourth insulating layer 45, thereby obtaining the structure of FIG. 4K.

After the recess 420 is filled with the fourth insulating layer 45, a mask pattern 425 is formed over the structure of FIG. 4K. The mask pattern 425 is a resist pattern having one or more openings corresponding to one or more gate contact portions. By using the mask pattern 425 as an etching mask, the first ESL 40 and the third insulating layer 20 are etched to form one or more openings 430, as shown in FIG. 4L. Then, the mask layer 425 is removed.

Further, the anchor layer 18 is etched through the openings 430 to the bottom of the trench, thereby forming one or more gate openings 435, as shown in FIG. 4M.

After the gate openings 435 are formed, a gate contact layer 50 is formed in and above the gate openings 435, as show in FIG. 4N, and a planarization operation, such as CMP, is performed to remove excess material of the gate contact layer 50, thereby obtaining the structure of FIG. 4O.

Subsequently, a second ESL 55 is formed on the structure of FIG. 4O by, for example, CVD, and further a fifth insulating layer 435 is formed by, for example, CVD, as shown in FIG. 4P. The fifth insulating layer 435 is made of, for example $SiO_2$ and has a thickness in a range from about 30 nm to about 100 nm, in some embodiments.

After the fifth insulating layer 435 is formed, a mask pattern 440 is formed over the structure of FIG. 4P. The mask pattern 440 is a resist pattern having one or more openings corresponding to the S/D electrodes 35. By using the mask pattern 440 as an etching mask, the fifth insulating layer 435, the second ESL 55, the fourth insulating layer 45 and the first ESL 30 are etched to form one or more openings 445, as shown in FIG. 4Q. Then, the mask layer 440 is removed.

After the openings 445 are formed, a S/D contact layer 60 is formed in and above the openings 445, as shown in FIG. 4R, and a planarization operation, such as CMP, is performed to remove excess material of the S/D contact layer 60, thereby obtaining the structure of FIG. 4S.

Subsequently, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, "pre-fabricated" CNT gate-all-around structures are prepared to provide work-function control and passivation structures over CNTs to avoid damage to CNTs during subsequent FET manufacturing processes. Since, the "pre-fabricated CNT structures are transferred to pre-defined trench(es) on the substrate, it is possible to align the CNTs with a high density, which results in a high density structure with high on-current characteristics. In addition, the "pre-fabricated" CNT gate-all-around structures can avoid performance degradation associated with CNT bundling issues caused by interaction between CNTs.

In accordance with an aspect of the present disclosure, in a method of forming a gate structure for a gate-all-around field effect transistor, a carbon nanotube (CNT) is disposed over a substrate. Anchor structures are formed on both ends of the CNT disposed over the substrate. After the anchor structures are formed, a part of the substrate under the CNT is recessed. After the substrate is recessed, a gate dielectric layer is formed wrapping around the CNT and a gate electrode layer is formed over the gate dielectric layer. The CNT with the gate dielectric layer and gate electrode layer is removed from the substrate, thereby forming the gate structure. In one or more foregoing or following embodiments, the substrate includes an intermediate layer formed on the substrate, and the CNT is disposed on the intermediate layer. The recessing includes removing the intermediate layer, and etching the substrate. In one or more foregoing or following embodiments, the method further includes, before removing the intermediate layer, covering the anchor structures with a cover material, and after the intermediate layer is removed, removing the cover material. In one or more foregoing or following embodiments, the method further includes, before forming the anchor structures, forming a cover layer over a part of the CNT disposed on the substrate, while end portions of the CNT are exposed, removing the exposed end portions of the CNT, and removing the cover layer. In one or more foregoing or following embodiments, the removing the CNT is performed by, introducing the substrate with the CNT with the gate dielectric layer and gate electrode layer into a solution and applying ultrasound to the solution, thereby removing the CNT with the gate dielectric layer and gate electrode layer from the substrate. In one or more foregoing or following embodiments, two or more CNT are separately disposed on the substrate. In one or more foregoing or following embodiments, the gate dielectric layer includes one selected from the group consisting of $HfO_2$ and $Al_2O_3$. In one or more foregoing or following embodiments, the gate electrode layer includes TiN.

In accordance with another aspect of the present disclosure, in a method of manufacturing a gate-all-around field effect transistor, a trench is formed over a substrate. Nano-tube structures are introduced into the trench, each of which includes a carbon nanotube (CNT) having a gate dielectric layer wrapping around the CNT and a gate electrode layer over the gate dielectric layer. An anchor layer is formed in the trench. A part of the anchor layer is removed at a source/drain (S/D) region. The gate electrode layer and the gate dielectric layer at the S/D region are removed, thereby exposing a part of the CNT at the S/D region. An S/D electrode layer is formed on the exposed part of the CNT. A part of the anchor layer at a gate region is removed, thereby exposing a part of the gate electrode layer of the gate structure. A gate contact layer is formed on the exposed part of the gate electrode layer. In one or more foregoing or following embodiments, the method further includes, after the exposing a part of the CNT at the S/D region and before the forming the S/D electrode layer, forming a first spacer layer on ends of the gate electrode layer and the gate dielectric layer. In one or more foregoing or following embodiments, the method further includes, after the anchor layer is formed, forming a cover dielectric layer over the anchor layer. In one or more foregoing or following embodiments, the method further includes, after the S/D electrode layer is formed, recessing the S/D electrode layer, and forming a second spacer layer. In one or more foregoing or following embodiments, the forming the trench includes, forming an insulating layer on the substrate, and patterning the insulating layer, thereby forming the trench. In one or more foregoing or following embodiments, the method further includes forming an S/D contact layer on the S/D electrode layer. In one or more foregoing or following embodiments, the arranging nano-tube structures into the trench includes, preparing a solvent in which the nano-tube structures are dispersed, applying the solvent over the substrate with the trench, and removing the solvent, thereby leaving the nano-tube structures in the trench. In one or more foregoing or following embodiments, in the trench, one of the nano-tube structures is in direct contact with at least four adjacent nano-tube structures. In one or more foregoing or following embodiments, the anchor layer is made of one of polysilicon and amorphous silicon. In one or more foregoing or following embodiments, the anchor layer is made of a dielectric material. In one or more foregoing or following embodiments, after the S/D electrode layer is formed, the CNT is in direct contact with and wrapped around the S/D electrode layer.

In accordance with another aspect of the present disclosure, a semiconductor device having a gate-all-around field effect transistor includes nano-tube structures disposed in a trench formed above a substrate. Each of the nano-tube structures includes a carbon nanotube (CNT). Ends of the nano-tube structures are embedded in an anchor layer. A gate structure is constituted by a part of the nano-tube structure, which includes the CNT having a gate dielectric layer wrapping around the CNT and a gate electrode layer over the gate dielectric layer. A source/drain (S/D) is constituted by a part of the nano-tube structure, in which the CNT is exposed and is in direct contact with and wrapped around an S/D electrode layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate structure for a gate-all-around field effect transistor, the method comprising:
   disposing a carbon nanotube (CNT) over a substrate;
   forming anchor structures on both ends of the CNT disposed over the substrate;
   after the anchor structures are formed, recessing a part of the substrate under the CNT;
   after the recessing, forming a gate dielectric layer wrapping around the CNT and forming a gate electrode layer over the gate dielectric layer; and
   removing the CNT with the gate dielectric layer and the gate electrode layer from the substrate, thereby forming the gate structure.

2. The method of claim 1, wherein:
   the substrate includes an intermediate layer formed on the substrate, and the CNT is disposed on the intermediate layer, and
   the recessing includes:
      removing the intermediate layer, and
      etching the substrate.

3. The method of claim 2, further comprising:
   before removing the intermediate layer, covering the anchor structures with a cover material; and
   after the intermediate layer is removed, removing the cover material.

4. The method of claim 1, further comprising, before forming the anchor structures:
   forming a cover layer over a part of the CNT disposed on the substrate, while end portions of the CNT are exposed;
   removing the exposed end portions of the CNT; and
   removing the cover layer.

5. The method of claim 1, wherein the removing the CNT is performed by:
- introducing the substrate with the CNT with the gate dielectric layer and gate electrode layer into a solution; and
- applying ultrasound to the solution, thereby removing the CNT with the gate dielectric layer and gate electrode layer from the substrate.

6. The method of claim 1, wherein two or more CNT are separately disposed on the substrate.

7. The method of claim 1, wherein the gate dielectric layer includes one selected from the group consisting of $HfO_2$ and $Al_2O_3$.

8. The method of claim 7, wherein the gate electrode layer includes TiN.

9. A method of manufacturing a gate-all-around field effect transistor, the method comprising:
- forming a trench over a substrate;
- introducing nano-tube structures into the trench, each of which includes a carbon nanotube (CNT) having a gate dielectric layer wrapping around the CNT and a gate electrode layer over the gate dielectric layer;
- forming an anchor layer in the trench;
- removing a part of the anchor layer at a source/drain (S/D) region;
- removing the gate electrode layer and the gate dielectric layer at the S/D region, thereby exposing a part of the CNT at the S/D region;
- forming an S/D electrode layer on the exposed part of the CNT;
- removing a part of the anchor layer at a gate region, thereby exposing a part of the gate electrode layer of the gate structure; and
- forming a gate contact layer on the exposed part of the gate electrode layer.

10. The method of claim 9, further comprising, after the exposing a part of the CNT at the S/D region and before the forming the S/D electrode layer, forming a first spacer layer on ends of the gate electrode layer and the gate dielectric layer.

11. The method of claim 9, further comprising, after the anchor layer is formed, forming a cover dielectric layer over the anchor layer.

12. The method of claim 11, further comprising, after the S/D electrode layer is formed:
- recessing the S/D electrode layer; and
- forming a second spacer layer.

13. The method of claim 9, wherein the forming the trench includes:
- forming an insulating layer on the substrate; and
- patterning the insulating layer, thereby forming the trench.

14. The method of claim 9, further comprising forming an S/D contact layer on the S/D electrode layer.

15. The method of claim 9, wherein the arranging nano-tube structures into the trench includes:
- preparing a solvent in which the nano-tube structures are dispersed;
- applying the solvent over the substrate with the trench; and
- removing the solvent, thereby leaving the nano-tube structures in the trench.

16. The method of claim 9, wherein in the trench, one of the nano-tube structures is in direct contact with at least four adjacent nano-tube structures.

17. The method of claim 9, wherein the anchor layer is made of one of polysilicon and amorphous silicon.

18. The method of claim 9, wherein the anchor layer is made of a dielectric material.

19. The method of claim 9, wherein after the S/D electrode layer is formed, the CNT is in direct contact with and wrapped around the S/D electrode layer.

20. A method of manufacturing a gate-all-around field effect transistor, the method comprising:
- forming nano-tube structures by:
  - disposing carbon nanotubes (CNTs) over a first substrate;
  - forming anchor structures on both ends of the CNTs disposed over the first substrate;
  - after the anchor structures are formed, recessing a part of the first substrate under the CNTs;
  - after the recessing, forming a gate dielectric layer and a gate electrode layer over the gate dielectric layer around each of the CNTs and forming; and
  - removing the CNTs with the gate dielectric layer and the gate electrode layer from the first substrate, thereby forming the nano-tube structures;
- forming a trench over a second substrate;
- introducing the nano-tube structures into the trench;
- forming an anchor layer in the trench;
- removing a part of the anchor layer at a source/drain (S/D) region;
- removing the gate electrode layer and the gate dielectric layer at the S/D region, thereby exposing a part of each of the CNTs at the S/D region;
- forming an S/D electrode layer on the exposed part of each of the CNTs;
- removing a part of the anchor layer at a gate region, thereby exposing a part of the gate electrode layer of the gate structure; and
- forming a gate contact layer on the exposed part of the gate electrode layer.

* * * * *